(12) United States Patent
Mujtaba

(10) Patent No.: US 6,477,680 B2
(45) Date of Patent: Nov. 5, 2002

(54) AREA-EFFICIENT CONVOLUTIONAL DECODER

(75) Inventor: Syed Aon Mujtaba, Berkeley Heights, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/105,759

(22) Filed: Jun. 26, 1998

(65) Prior Publication Data

US 2002/0010895 A1 Jan. 24, 2002

(51) Int. Cl.$^7$ .............................................. H03M 13/41
(52) U.S. Cl. ..................................... 714/795; 714/796
(58) Field of Search .................. 714/792, 794, 714/795

(56) References Cited

U.S. PATENT DOCUMENTS

| | | | | |
|---|---|---|---|---|
| 4,346,473 A | * | 8/1982 | Davis | 371/43 |
| 4,583,078 A | * | 4/1986 | Shenoy et al. | 340/347 DD |
| 5,027,374 A | * | 6/1991 | Rossman | 375/94 |
| 5,272,706 A | * | 12/1993 | Park | 371/43 |
| 5,307,374 A | | 4/1994 | Baier | |
| 5,418,795 A | * | 5/1995 | Itakura et al. | 371/30 |
| 5,446,746 A | * | 8/1995 | Park | 371/43 |
| 5,450,338 A | * | 9/1995 | Oota et al. | 364/715.1 |
| 5,471,500 A | * | 11/1995 | Blaker et al. | 375/340 |
| 5,550,870 A | * | 8/1996 | Blaker et al. | 375/341 |
| 5,822,341 A | * | 10/1998 | Winterrowd et al. | 371/43.7 |
| 5,887,036 A | * | 3/1999 | Temerinac | 375/341 |
| 5,923,713 A | * | 7/1999 | Hatakeyama | 375/341 |
| 5,987,638 A | * | 11/1999 | Yu et al. | 714/795 |

OTHER PUBLICATIONS

Bree et al., "A Bit–Serial Architecture for a VLSI Viterbi Processor", CH2595–7/88/0000–0072, pp. 72–77, Dec. 1988.*

Andrew J. Viterbi, "CDMA: Principles of Spread Spectrum Communication," pp. 132–138, Addison–Wesley, 1995.

R. Cypher and C.B. Shung, "Generalized Traceback Techniques for Survivor Memory Management in the Viterbi Algorithm," IEEE Globecom, pp. 1318–1322, Dec. 1990.

H. Lou, "Viterbi Decoder Design for the IS–95 CDMA Forward Link," IEEE 46th Vehicular Technology Conference, vol. 2, No. 46, pp. 1346–1350, Apr. 1996.

C.B. Shung et al., "Area–Efficient Architectures for the Viterbi Algorithm–Part I: Theory," IEEE Transactions on Communications, vol. 41, No. 4, pp. 636–444, Apr. 1993.

* cited by examiner

*Primary Examiner*—Stephen M. Baker
(74) *Attorney, Agent, or Firm*—Ryan, Mason & Lewis, LLP

(57) ABSTRACT

A convolutional decoder for decoding received symbols in a communication system includes a branch metric calculator, and add-compare-select engine and a traceback unit. The branch metric calculator computes branch metrics for transitions in a trellis representative of a convolutional code used to generate the symbols. In accordance with the invention, the branch metrics are computed from an offset binary representation of the symbols using an inverse likelihood function, such that the resulting path metrics grow at a smaller rate and therefore require less memory. The add-compare-select engine processes path metrics generated from the branch metrics so as to determine a selected path through at least a portion of the trellis, and may utilize a state-serial architecture which computes path metrics for k states of a given stage of the trellis per clock cycle, using branch metrics obtained from k sets of registers in the branch metric calculator. The traceback unit generates a sequence of decoded bits from the selected path, and may be configured to include a staging register and a traceback memory. The staging register receives selected path information from the add-compare-select engine, and the contents of the staging register for a given stage of the trellis are loaded into the traceback memory when the staging register becomes full, at a location given by a number of the stage modulo a predetermined traceback length.

23 Claims, 19 Drawing Sheets

NUMBER OF POSSIBLE PATHS

FIG. 11

| RECEIVED SYMBOL | DISTANCE FROM "0" | DISTANCE FROM "1" |
|---|---|---|
| 0000 | 0000 | 1111 |
| 0001 | 0001 | 1110 |
| 0010 | 0010 | 1101 |
| 0011 | 0011 | 1100 |
| 0100 | 0100 | 1011 |
| 0101 | 0101 | 1010 |
| 0110 | 0110 | 1001 |
| 0111 | 0111 | 1000 |
| 1000 | 1000 | 0111 |
| 1001 | 1001 | 0110 |
| 1010 | 1010 | 0101 |
| 1011 | 1011 | 0100 |
| 1100 | 1100 | 0011 |
| 1101 | 1101 | 0010 |
| 1110 | 1110 | 0001 |
| 1111 | 1111 | 0000 |

AREA-EFFICIENT CONVOLUTIONAL DECODER

FIELD OF THE INVENTION

The present invention relates generally to digital communication systems, and more particularly to Viterbi decoders and other convolutional decoders for use in such systems.

BACKGROUND OF THE INVENTION

Channel coding is a conventional technique commonly used to increase the robustness of a digital communication system. The principle underlying channel coding is to introduce redundancy and memory into the transmitted bit stream so as to facilitate error detection and correction at the decoder. Two general classes of channel codes are block codes and trellis codes. Block codes operate on a block-by-block basis, such that output code words depend only on the current input block message. Trellis codes, in contrast, may be viewed as mapping one arbitrarily long bit stream into another, with no assumed block structure. A commonly-used linear class of trellis codes are known as convolutional codes. In such codes, output codewords result from the convolution of an input message stream with the impulse response of an encoder which includes a v-stage shift register. A given n-bit code word is generated as a function of m input bits and v bits stored in the shift register. The constraint length K of the encoder is defined as m+v, and the rate of the code is given by m/n, where n>m.

A convolutional encoder operates as a finite state machine with a maximum of $N=2^v=2^{K-m}$ possible states. The m input bits cause a transition from a present state, defined by v bits, to the next state, and the number of output bits, i.e., code bits, produced depends on the rate of the code. The transitions from one state to another when viewed as a function of time result in a graph commonly known as a "trellis." FIG. 1 shows a trellis diagram for a rate 1/2 convolutional code with a constraint length K=4. This code includes $N=2^{K-m}$ or 8 possible states, each corresponding to a group of v=3 bits and designated by one of eight dots in each of an "old state" and "new state" column. The diagram shows all of the possible transitions between a given one of the old states and the new states that can be reached from the given old state. Since m=1 in this example, the encoding process dictates that there can be only two transitions out of a state and two transitions into a state. In general, for m input bits, there are $2^m$ transitions out of and into a state. For a code with m=2, there would be four such transitions.

It should be noted that the state assignment shown in FIG. 1 is arbitrary to some degree. The convention adopted in this example is that the input bit shifts into the least significant bit (LSB) of the shift register while the most significant bit (MSB) shifts out of the register. According to this convention, two states differing in the MSB converge onto the same state when an input is shifted into the LSB. For example, the 0 and 4 states both converge to the 0 state when a 0 is shifted into the register. More generally, two states differing by N/2 in their state assignment converge to the same state under the same input condition. In addition, if a 0 is shifted into the LSB of the register, the new state will be an even state, and conversely, a 1 shifted into the LSB leads to an odd state. Since an upshifting operation is equivalent to multiplication by 2, the process can be generalized by the following transitions: an input 0 causes state j to go to state 2j, while an input 1 causes state j to go to 2j+1; similarly, an input 0 causes state j+N/2 to go to 2j, while an input 1 causes state j+N/2 to go to 2j+1. These transitions are illustrated in FIG. 2 for a rate 1/2 code, and the resulting computational structure is commonly known as a "butterfly."

The convolutional encoding process can be viewed as tracing a path through the trellis diagram. FIG. 3 shows one such path traced through an 8-state trellis as a function of time. The vertical axis denotes the state numbers in ascending order, and the horizontal axis represents time. Each stage of the trellis represents a period of time T. Typically, the shift register is initialized to start at the 0 state. For each of the transitions shown in FIG. 3, n code bits are generated. Thus, the objective of the corresponding decoding process is to retrace this path through the trellis based on the received code symbols. FIG. 4 shows all of the possible paths for an 8-stage trellis over a period of 7T. At time T, there are 8 possible paths, at time 2T, there are 16, and so on. Thus, the number of possible paths grows exponentially with time. Note that each path is a particular sequence of transitions from one trellis stage to the next. Hence, a "path metric" for a given path is given by the sum of the individual transition metrics, i.e, "branch metrics." The decoding process therefore generally involves the steps of: (1) computing branch metrics based on the received code symbols; (2) computing path metrics by summing branch metrics; (3) selecting an optimal path after a certain time; and (4) performing a "traceback" operation along the optimal path to extract the corresponding input bits. In Viterbi decoding, the problem of exponential growth in the number of paths is solved by selecting, at each time step, one of two converging paths. As a result, the number of paths under consideration remains constant with time. This elimination of paths at each time step, i.e., at each trellis stage, is referred to as an add-compare-select (ACS) operation.

FIG. 5 shows the general structure of a conventional Viterbi decoder 10. The decoder 10 includes a branch metric calculator 12, a recursive ACS engine 14, and a traceback unit 16. Soft symbols are applied via an input buffer 18 to the calculator 12. The calculator 12 computes the branch metrics associated with all possible transitions for a given stage of the trellis. Regardless of the number of states in the trellis, the number of unique branch metrics for a rate 1/n convolutional code is given by $2^n$. That is because for a rate 1/n code, there are only $2^n$ unique code n-tuples. While there are $2^m$. N branches in the trellis, and with each branch there is associated a particular n-tuple of code bits, there can only be as many unique branch metrics as there are n-tuples. The ACS engine 14 is recursive since the new path metrics depend on the path metrics computed for the previous stage and the branch metrics corresponding to the transitions from the previous stage to the next stage. The output of the ACS engine 14 is supplied to the traceback unit 16, and the resulting output is buffered in output buffer 20. A finite-state-machine controller 22 controls the operation of the various elements of the Viterbi decoder 10.

FIG. 6A illustrates an exemplary add-compare-select operation in greater detail. Two initial stages, j and J, separated by N/2, converge to a state 2j. The accumulated path metric associated with j is given by $\Gamma_j$ and that associated with J is given by $\Gamma_J$. The respective branch metrics $\lambda_{j0}$ and $\lambda_{J0}$, where 0 represents the transition caused by a 0 input, are added to the path metrics $\Gamma_j$ and $\Gamma_J$, respectively, and depending on the branch metric calculation process, either the minimum or maximum metric path is selected. For example, the maximum is chosen when the branch metric is proportional to the inner product between a received symbol and the corresponding code symbol.

Conversely, the minimum is chosen when the branch metric is proportional to the Euclidean distance between the received and code symbols. FIG. 6B shows circuitry for implementing this add-compare-select operation, including adders 30, a compare unit 32 and a select unit 34.

FIGS. 7A, 7B and 7C illustrate various conventional architectures for the ACS engine 14 of FIG. 5. FIG. 7A shows a state-serial architecture which includes an ACS unit 40 and a state metric (i.e., path metric) random access memory (RAM) 42. An ACS engine 14 with this architecture sequences through a trellis stage, retrieving old path metrics from the RAM 42, and writing back the new path metrics to the RAM 42. Although such an architecture is extremely area-efficient, it is also very slow, and can generally only be used in very low data rate applications, such as speech processing. FIG. 7B shows a state-parallel architecture which attempts to update all of the path metrics in a given trellis stage simultaneously. This architecture includes an ACS unit 40-i, i=1, 2, . . . N, as well as first and second memory units 44-i and 48-i, for each of the N states of the trellis. A routing network 46 is used to supply the appropriate metrics to the various ACS units 40-i as required. While this architecture provides a high throughput, the routing network can take up a very large amount of area. Such architectures are generally not feasible if the constraint length of the convolutional code is large, since the required area increases exponentially with constraint length. FIG. 7C shows a so-called "shuffle-exchange" (SE) architecture which makes use of both spatial and temporal parallelism. The SE architecture of FIG. 7C includes a number of butterfly structures 50 arranged as shown, and each butterfly structure 50 includes a pair of ACS units 40A and 40B. Instead of computing just one trellis stage, the SE architecture can compute a few trellis stages before feeding back the output to the input. However, the SE architecture suffers from the same drawbacks as the state-parallel approach in that it is prohibitive to implement for a code with a large constraint length.

It is therefore apparent that further improvements are needed in Viterbi decoding techniques in order to provide decoders which are more area-efficient and can be implemented with reduced complexity and cost in a wide variety of applications, such as in wireless base station receivers and other applications which utilize codes with large constraint lengths.

SUMMARY OF THE INVENTION

The invention provides apparatus and methods for area-efficient implementation of convolutional decoding techniques. An illustrative embodiment for decoding received symbols in a communication system includes a branch metric calculator, an ACS engine and a traceback unit. The branch metric calculator computes branch metrics for transitions in a trellis representative of a convolutional code used to generate the symbols. In accordance with one aspect of the invention, the branch metrics are computed from an offset binary representation of the symbols using an inverse likelihood function, such that a strong match between a given received symbol and a possible codeword of the convolutional code results in a small branch metric, while a weaker match between a given received symbol and a possible codeword results in a larger branch metric. The corresponding path metrics therefore grow at a smaller rate, require less memory, need less word width, and result in infrequent renormalizations. This offset binary technique results in an implementation that is approximately 25% more area-efficient than a corresponding conventional 2's complement implementation.

The ACS engine processes path metrics generated from the branch metrics so as to determine a selected path through at least a portion of the trellis. In accordance with another aspect of the invention, the ACS engine may utilize a state-serial architecture which computes path metrics for k states of a given stage of the trellis per clock cycle, using branch metrics obtained from k sets of registers in the branch metric calculator. The ACS engine may also include a plurality of distinct memories operating in a "ping-pong" fashion, such that during a given trellis stage, path metrics are read from a first one of the memories and written to a second one of the memories, and during a subsequent trellis stage path metrics are read from the second one of the memories and written to the first one of the memories. The memory configuration remains unchanged in going, for example, from k=2 to k=4. An embodiment of the ACS engine with k=4 uses four distinct memories and performs two butterfly computations per clock cycle. However, for k>4, additional memory may be required. The invention thus provides an optimal memory configuration and a speedup in ACS computations by approximately a factor of two in an embodiment with k=4. For example, with k=4, it can be shown that maximum throughput is obtained for minimum memory area in an implementation in which the number of states N=256, the constraint length K=9, and the traceback length =64.

The traceback unit generates a sequence of decoded bits from the selected path. In accordance with yet another aspect of the invention, the traceback unit may be configured to include a staging register and a traceback memory. The staging register receives selected path information from the ACS engine. The contents of the staging register for a given stage of the trellis are loaded into the traceback memory when the staging register becomes full, at a location given by a number of the stage modulo a predetermined traceback length. Traceback is initiated when the traceback memory becomes full. During traceback, the traceback unit generates the decoded bits from a given portion of the traceback memory, and the given portion is subsequently filled with additional selected path information from the staging register. The staging register generally writes non-contiguous data to the traceback memory, and a pair of series-connected multiplexers can be used to extract a relevant bit from a given set of bits in the traceback memory. This traceback aspect of the invention can reduce the amount of traceback memory required in the decoder by a factor of 50% or more relative to conventional arrangements.

The invention is particularly well suited for use in applications such as a very large scale integrated (VLSI) implementation of an area-efficient Viterbi decoder for an IS-95 (North American Narrowband CDMA) base station receiver, although it can provide similar advantages in numerous other applications.

BRIEF DESCRIPTION OF THE DRAWINGS

FIGS. 10 and 11 illustrate a binary offset representation for use in branch metric computation in a Viterbi decoder in accordance with the invention.

DETAILED DESCRIPTION OF THE INVENTION

The present invention will be illustrated herein using an exemplary Viterbi decoder designed for implementation in a VLSI circuit in an IS-95 (North American Narrowband CDMA) base station receiver. It should be understood that this is merely an illustration of one particular application of the invention, and that the invention is more generally applicable to any convolutional decoding process which can benefit from reduction in the cost and complexity of implementation. An "area-efficient" decoder as the term is used herein refers generally to a decoder which, when implemented in a VLSI circuit or other embodiment in which chip area is at a premium, occupies a smaller chip area than a corresponding conventional implementation. The term "convolutional decoder" as used herein should be understood to include any type of Viterbi decoder as well as other types of convolutional decoders.

The IS-95 air interface for direct-sequence code division multiple access (DS/CDMA) specifies rate 1/3 and rate 1/2 convolutional encoding, with a constraint length K=9, at the mobile station transmitter. The IS-95 reverse link channels include both access channels and traffic channels. There are two rate sets for the traffic channels: 14.4 kbps and 9.6 kbps. The 14.4 kbps channel is encoded at rate 1/2 while the 9.6 kbps channel is encoded at rate 1/3. Each of these rate sets operate on a variable data rate: full rate, half rate, quarter rate and eighth rate. In contrast, the access channels operate at a fixed data rate of 4.8 kbps. For each of these channels, the constraint length for the encoding process is K=9, and there are $N=2^{K-m}$ or 256 states in the corresponding trellis. For comparison purposes, the constraint lengths in the IS-136 (TDMA) and GSM standards are 6 and 5, respectively. Clearly, for a cost-effective implementation of the IS-95 protocol compared to IS-136, and GSM, an area-efficient design of the Viterbi decoder is essential.

Figure 1:
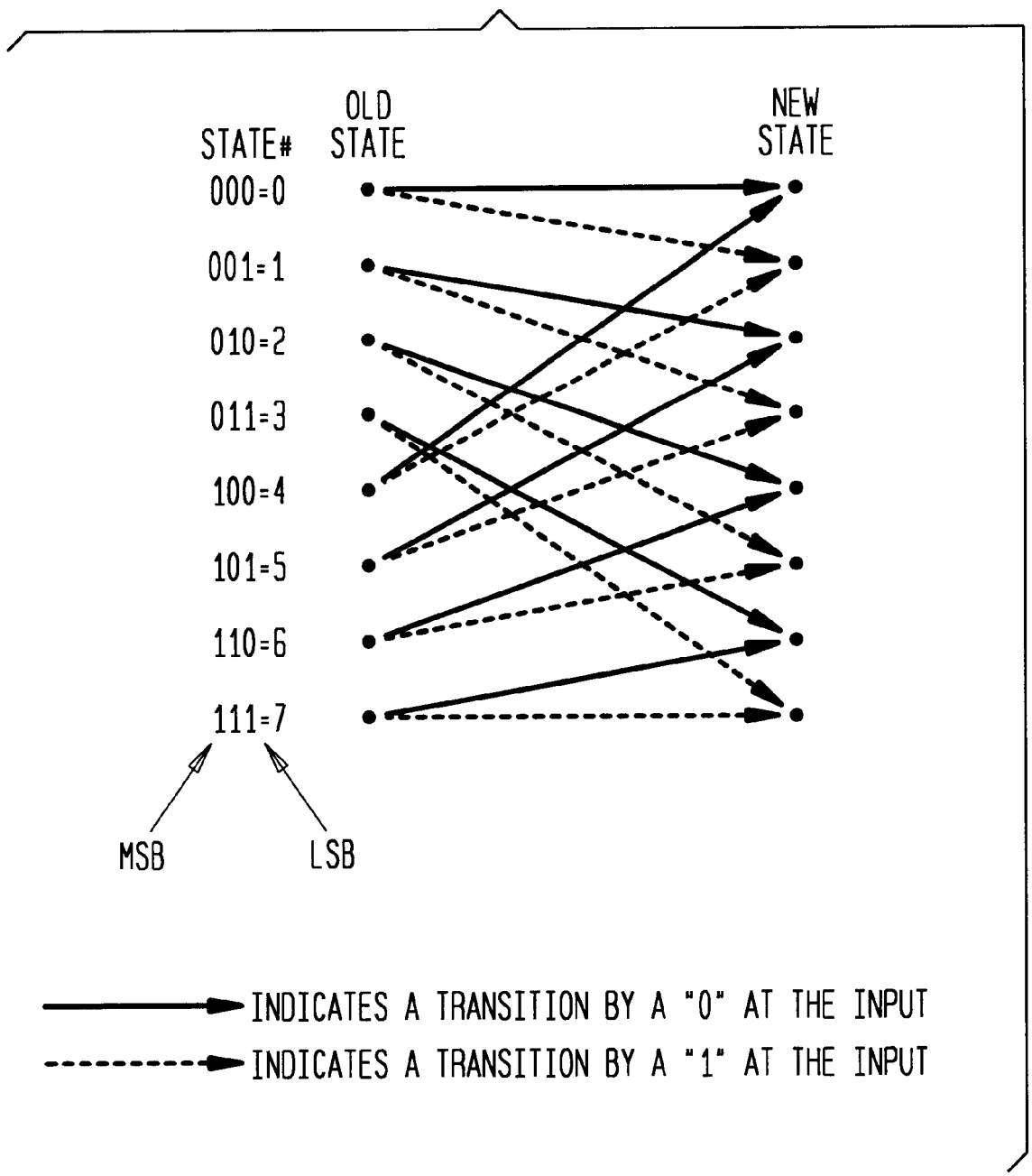
FIGS. 1 through 4 illustrate various aspects of conventional coding operations.
Figure 2:
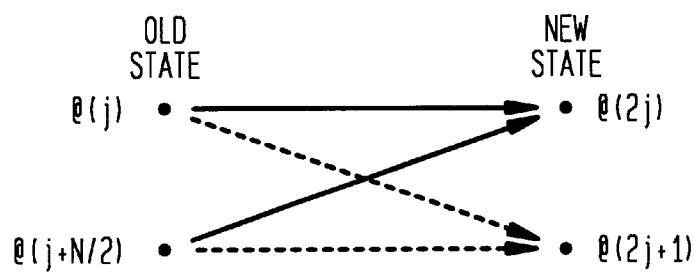
Figure 3:
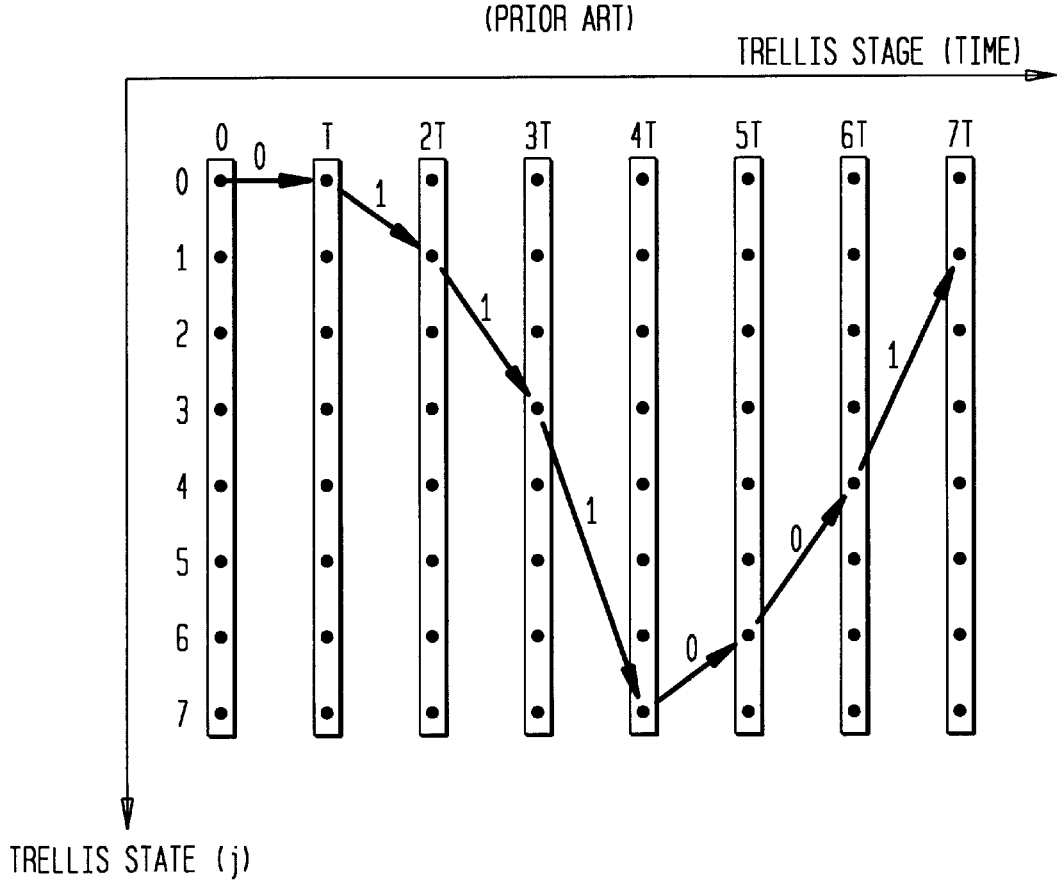
Figure 4:
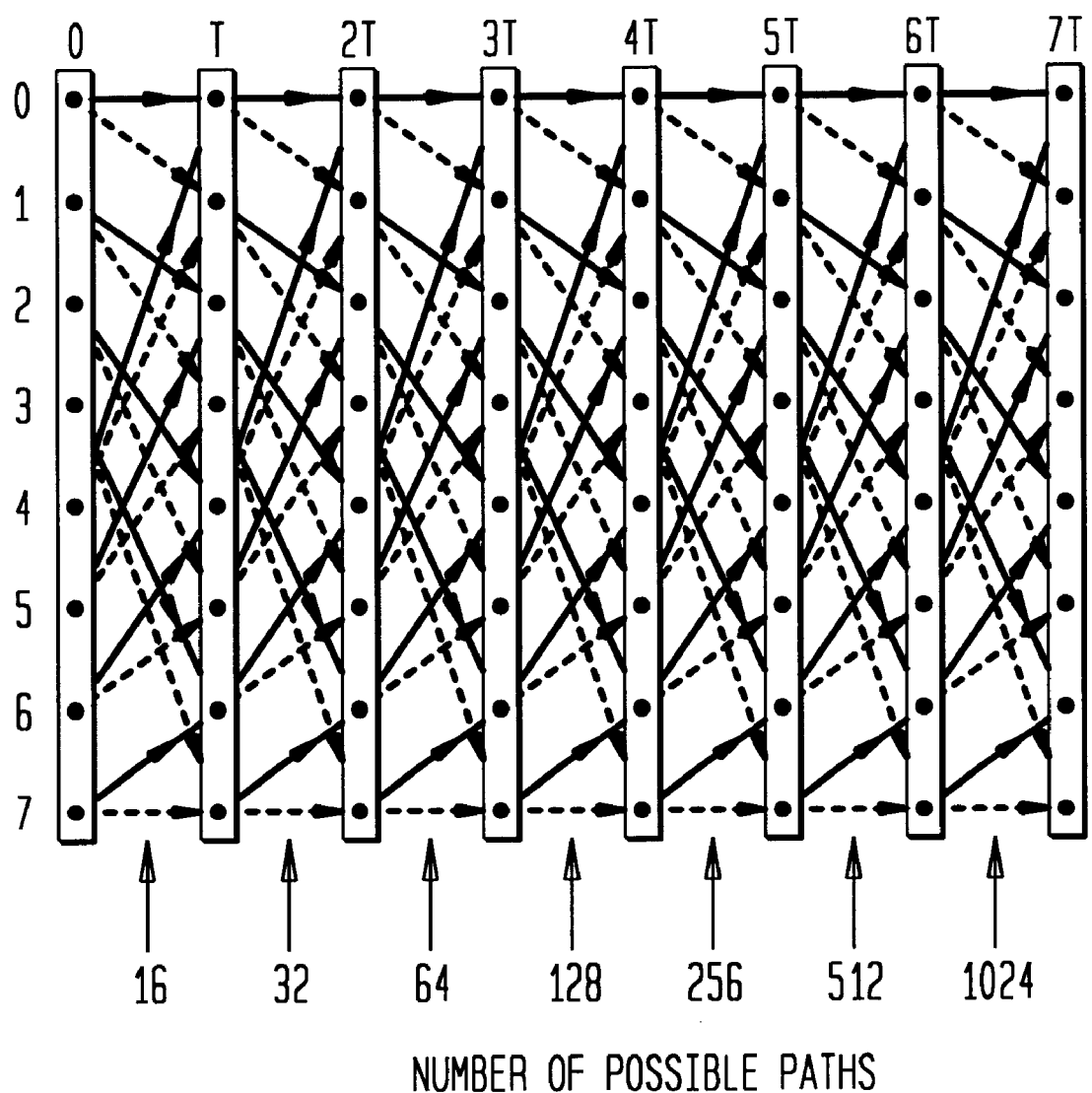
Figure 5:
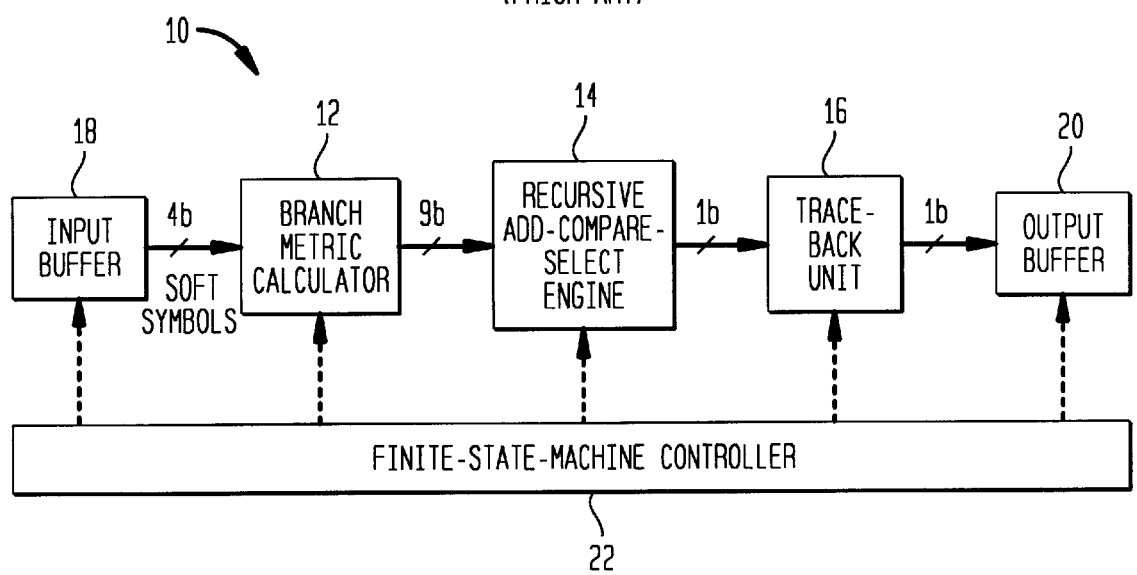
FIG. 5 is a block diagram of a conventional Viterbi decoder.
Figure 6A:
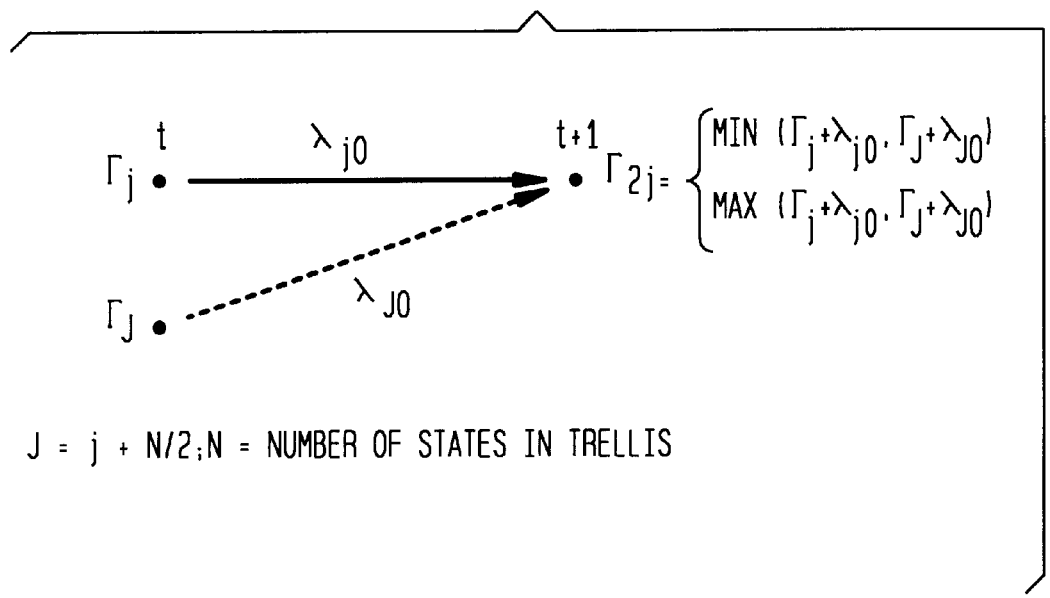
FIGS. 6A and 6B illustrate add-compare-select (ACS) operations in the FIG. 5 decoder.
Figure 6B:
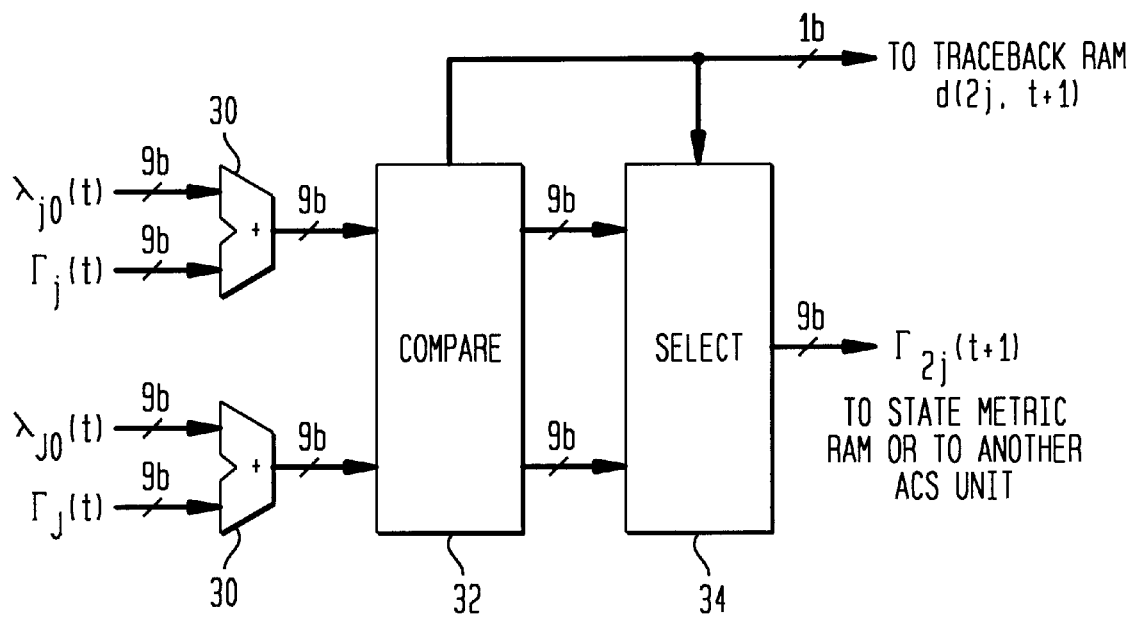
Figure 7A:
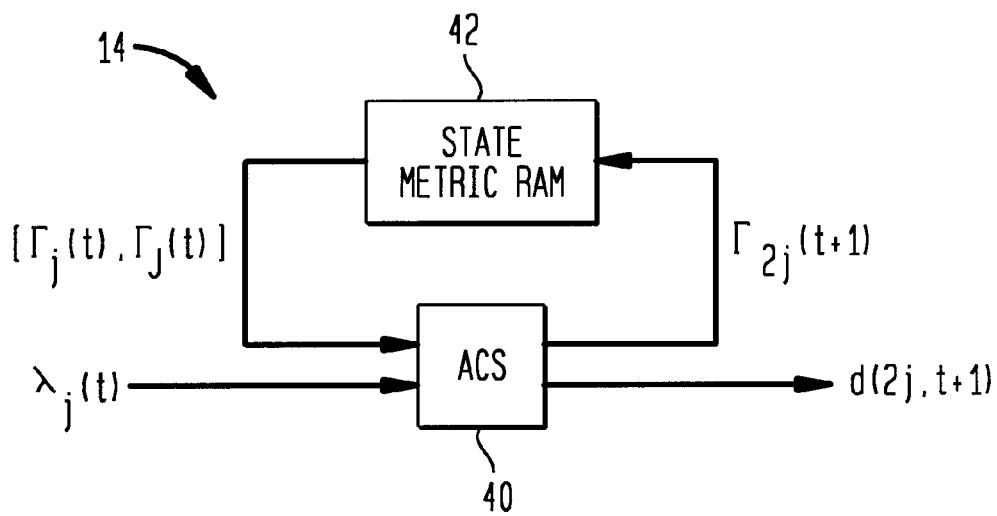
FIGS. 7A, 7B and 7C show conventional implementations for an ACS engine in the Viterbi decoder of FIG. 5.
Figure 7B:
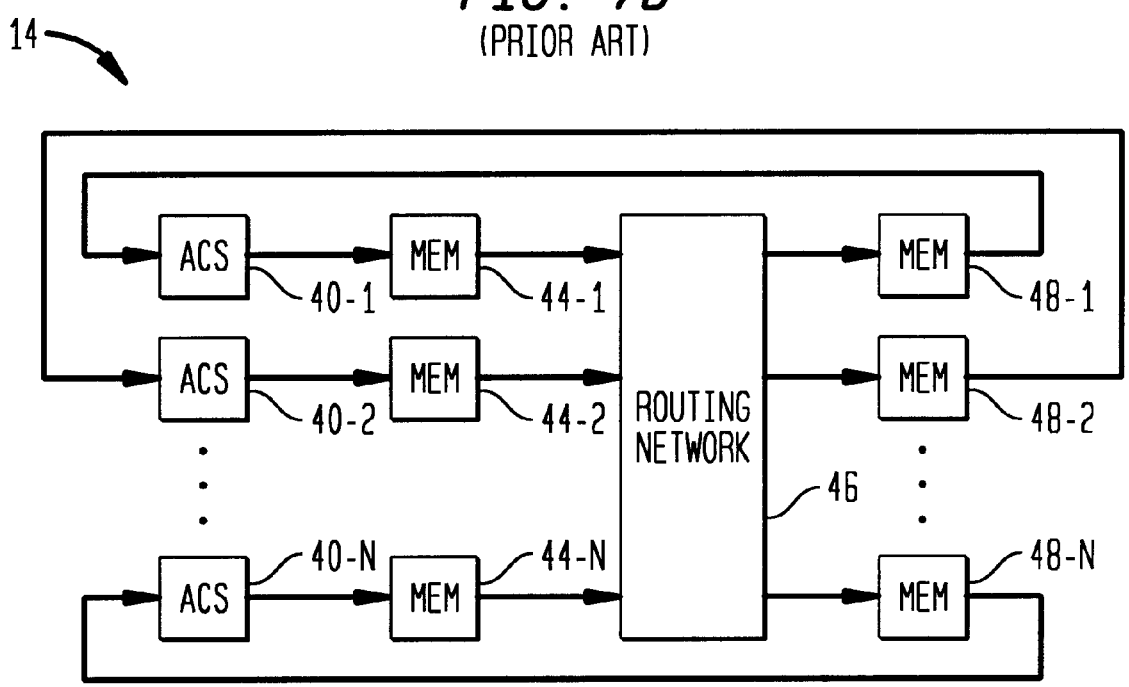
Figure 7C:
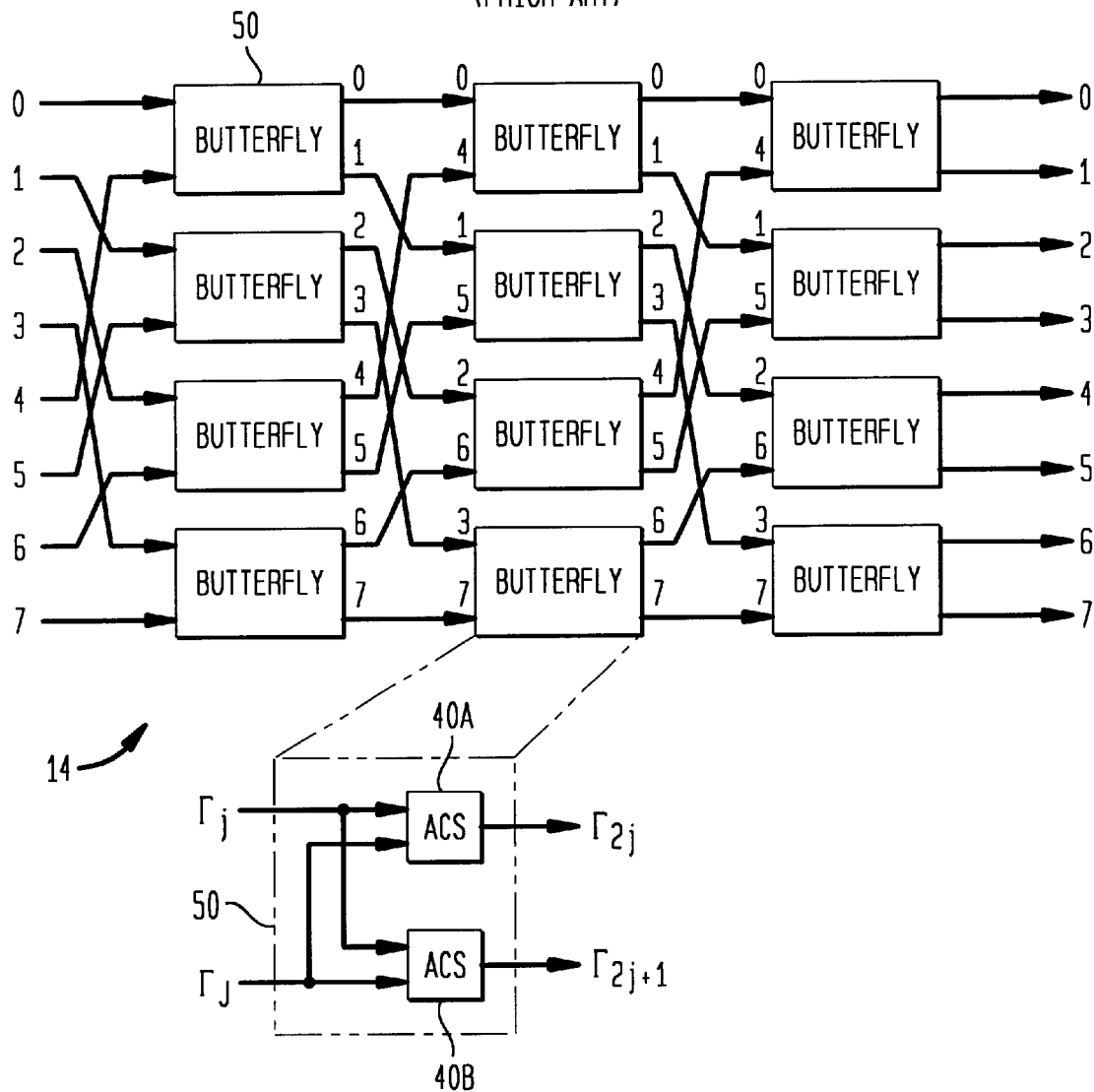
Figure 8:
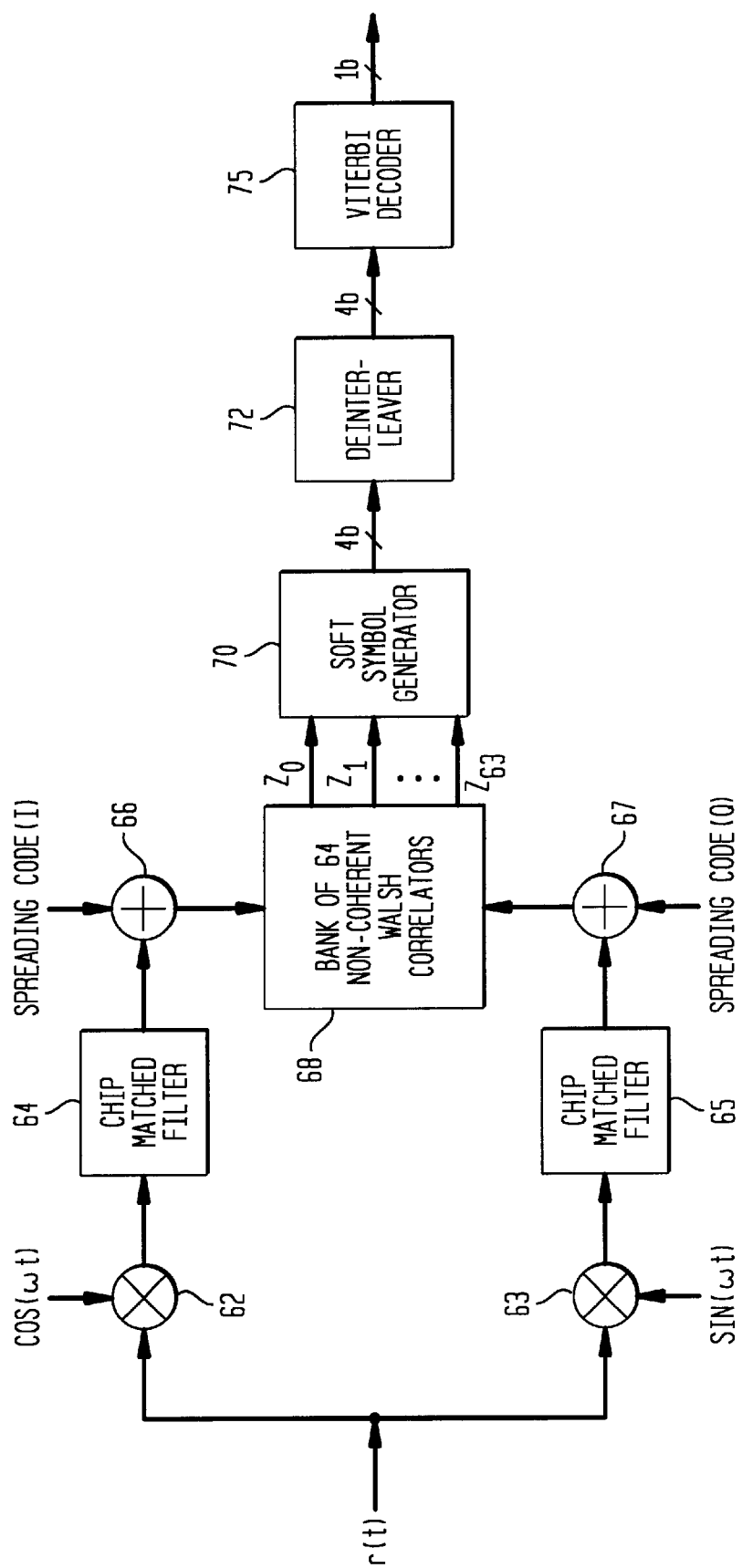
FIG. 8 shows an IS-95 base station receiver in which an area-efficient Viterbi decoder in accordance with the invention can be implemented.

FIG. 8 shows an IS-95 base station receiver 60 in which an area-efficient Viterbi decoder in accordance with the invention can be implemented. A received signal r(t) is quadrature demodulated using mixers 62, 63 and chip matched filters 64, 65, and then despread in elements 66 and 67 using the in-phase (I) and quadrature (Q) versions of a spreading code. The resulting despread signals are applied to a bank 68 of sixty-four non-coherent Walsh correlators which estimate probabilities $Z_0, Z_1, \ldots Z_{63}$ that a particular Walsh symbol was received. Rather than making a hard decision at the output of the bank of correlators, the various probabilities $Z_0, Z_1, \ldots Z_{63}$ are sent to soft symbol generator (SSG) 70. Since each Walsh symbol represents six coded bits, the purpose of the SSG 70 is to assign a soft value to each of the six bits based on the $Z_j$ values. Although this soft decision process introduces further complexity, it provides an increase of about 1.5 to 2.0 dB in coding gain over hard decision decoding. The output of the SSG 70 is passed to a deinterleaver 72 which serves to randomize bursty errors, and the output of the deinterleaver 72 is supplied to an area-efficient Viterbi decoder 75 configured in accordance with the invention.

Figure 9:
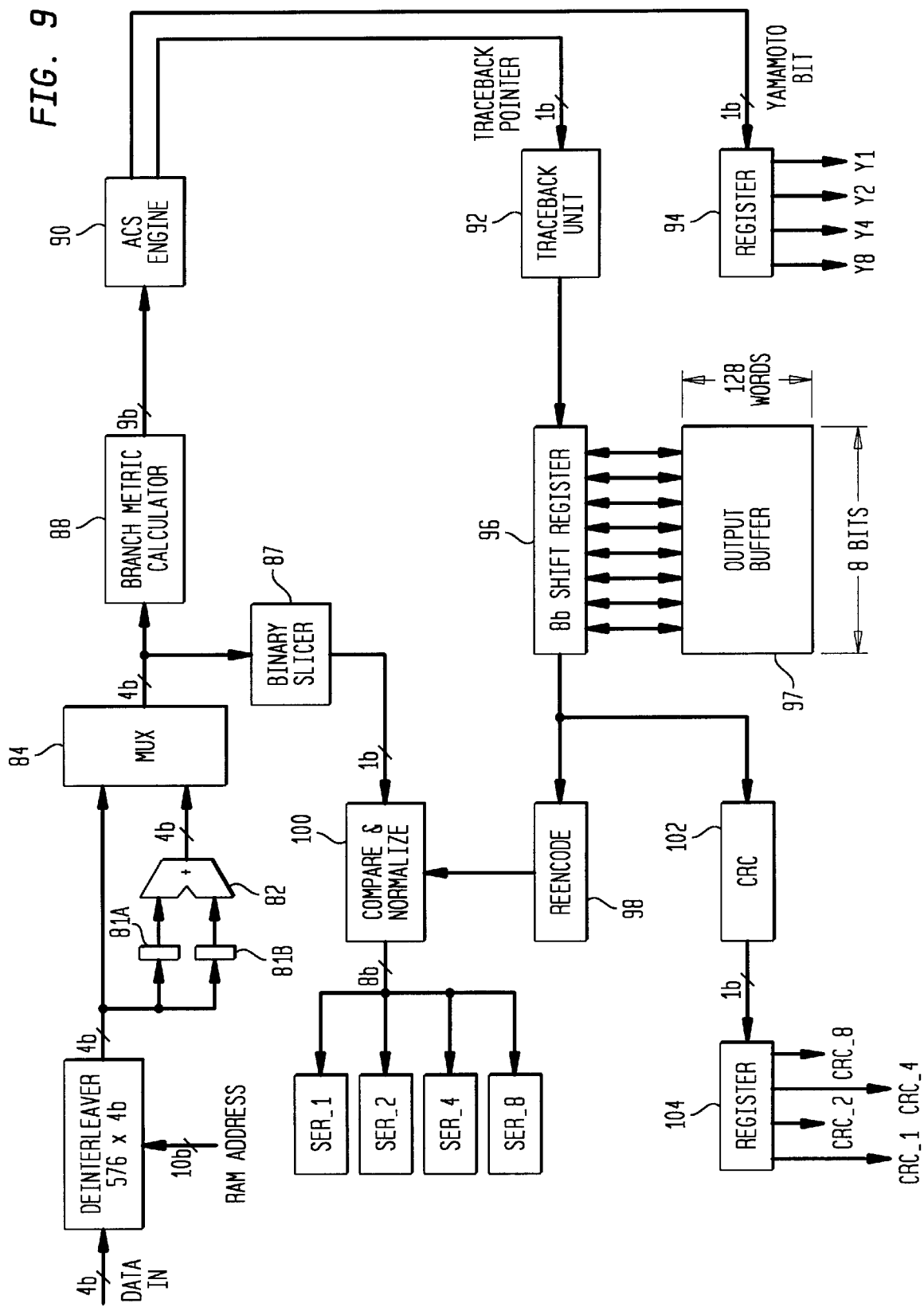
FIG. 9 is a block diagram of an illustrative embodiment of an area-efficient Viterbi decoder in accordance with the invention.

FIG. 9 is a block diagram of an illustrative embodiment of the Viterbi decoder 75 of FIG. 8. For the access channel, the information data rate is 4.8 kbps, which is encoded at rate 1/3, and then repeated twice, and then interleaved. Thus at the base station receiver, after deinterleaving in deinterleaver 72, the repeated bits from registers 81A and 81B are added together in an adder 82 to arrive at a 5-bit soft symbol value which is applied to a multiplexer 84 after being scaled down to four bits. For the traffic channels, the repeated bits are blanked out based on the data-burst randomization (DBR) algorithm described in the IS-95 standard, and the soft symbol values read from the deinterleaver 72 are passed straight through to the multiplexer. If the channel is an AWGN channel, then the optimal calculation of the branch metrics is based on the inner product or the Euclidean distance. The 4-bit output of the multiplexer 84 is passed to a binary decision slicer 87 and a branch metric calculator 88. The binary slicer 87 makes a hard decision and supplies the results to a compare and normalize unit 100. These hard decision values are later used to compute a symbol error rate.

For a given trellis stage, the branch metric calculator 88 calculates all of the unique branch metrics and stores them in a register file. These branch metrics are then retrieved by an ACS engine 90 as it updates the path metrics. The ACS engine 90 in this embodiment outputs 1-bit traceback pointers that are supplied to a traceback unit 92 and stored in an associated traceback memory. The ACS engine 90 also generates a so-called "Yamamoto bit" that is latched into a decoder status register 94 only for the 0 state at the final stage of the trellis. The Yamamoto bit serves to indicate the robustness of the path elimination process in the ACS engine 90.

Figure 17:
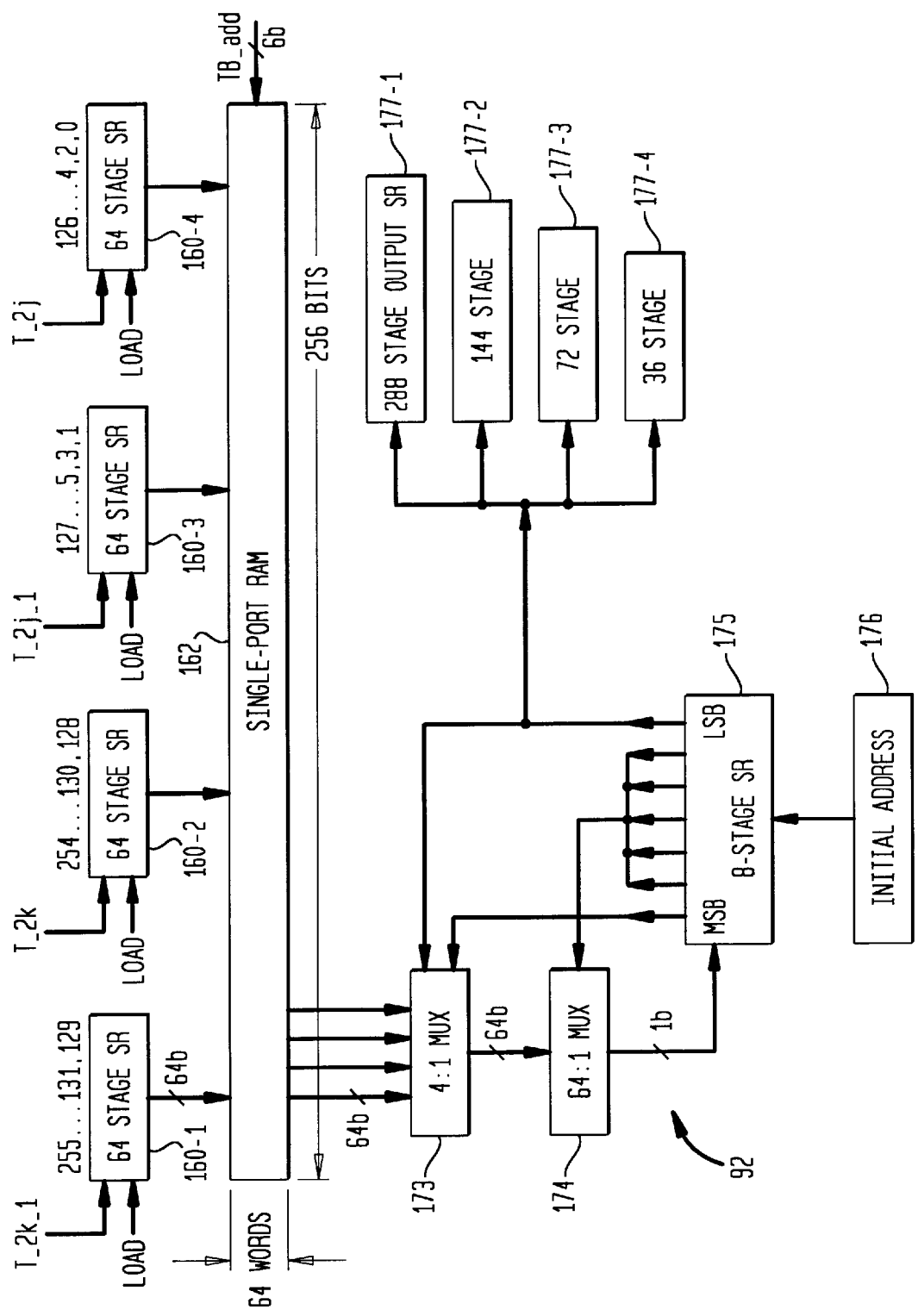
FIG. 17 shows an illustrative embodiment of a traceback unit incorporating the traceback memory technique of FIGS. 16A through 16G and suitable for use in the Viterbi decoder of FIG. 9.

Since the data transmission in this IS-95 application is variable, the Viterbi decoder 75 computes all four rates, i.e., full, half, quarter and eighth, and delivers the results via a shift register 96 to an output buffer 97. In an alternative implementation, separate shift registers 177-1, 177-2, 177-3 and 177-4 as shown in FIG. 17 may be used in place of output buffer 97 for storing the full, half, quarter and eighth rate outputs, respectively. An output bit is generated by the traceback unit 92 every 64 cycles, which corresponds to the length of the traceback memory. The output bits from shift register 96 are reencoded in a reencoder 98, and compared in the compare and normalize unit 100 to the hard decision values from the binary slicer 87. The results are stored in a set of symbol error rate (SER) registers SER_1, SER_2, SER_4 and SER_8. A cyclic redundancy code (CRC) check is performed in a CRC unit 102 on all of the rates of the 14.4 kbps rate set and on the full and half rates for the 9.6 kbps rate set, and the results CRC_1, CRC_2, CRC_4 and CRC_8 are stored in a register 104. Using the CRC, SER and Yamamoto bit information, the decoder 75 can determine which rate was transmitted in a given frame.

Figure 10:
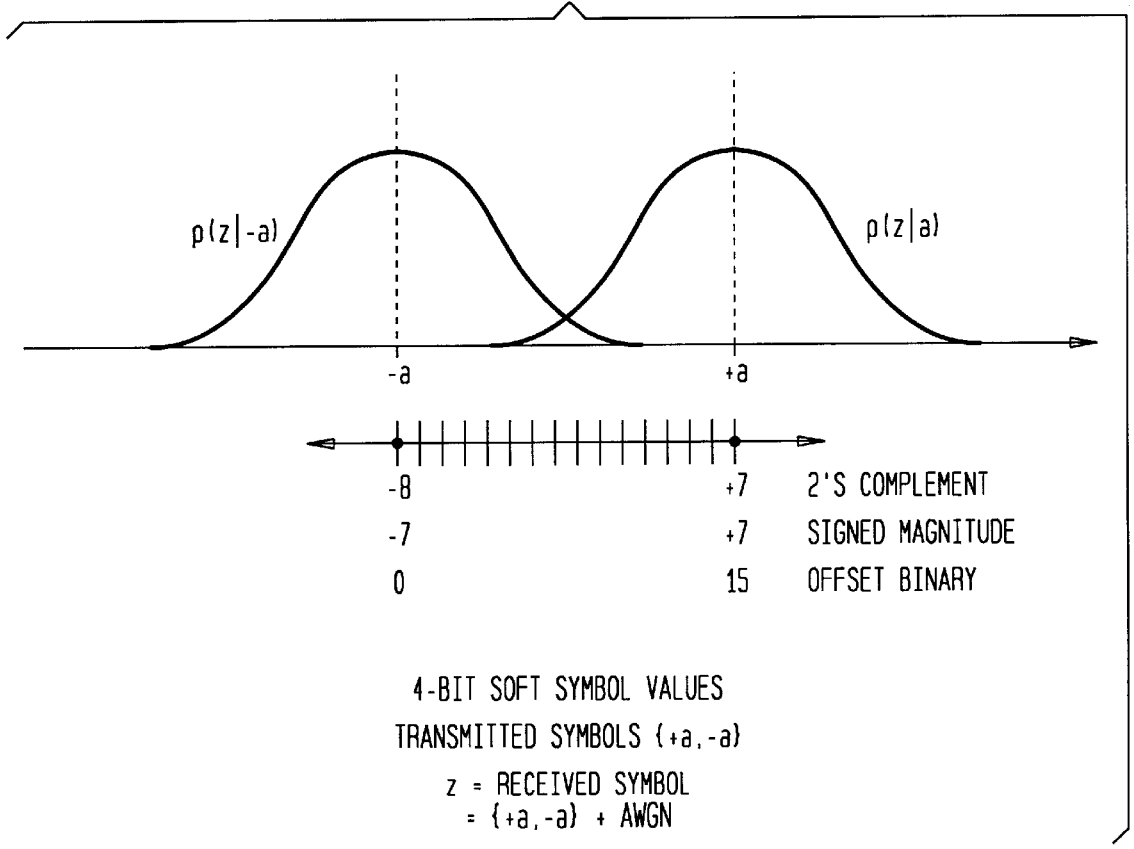

FIGS. 10 and 11 illustrate various aspects of branch metric calculation in accordance with the invention. As shown in FIG. 10, the presence of noise can cause received symbols to deviate from their actual transmitted values a and −a. Assuming the noise to be Gaussian, the probability distribution function p(z|a) in FIG. 10 can be written as:

$$p(z|a) = \frac{1}{\sqrt{2\pi\sigma^2}} e^{-\frac{(z-a)^2}{2\sigma^2}}.$$

For a rate 1/n code, it can be shown that the likelihood function, defined as $\log_e p(z|a)$, and thus the branch metric (BM), is given by:

$$BM = \sum_n z_n a_n$$

which for $a_n = \pm 1$, reduces to additions and subtractions. See Andrew J. Viterbi, "CDMA: Principles of Spread Spectrum Communication," Addison-Wesley, 1995. A given branch metric is thus obtained by summing over n distances. In conventional systems, a received symbol z is typically represented by 2's complement notation as illustrated in FIG. 10. Since linear transformations do not alter the likelihood function, if a constant such as +8 is added to all of the 2's complement values, the result is the offset binary representation as shown. Note that in the conventional 2's complement technique, a strong match results in a large branch metric. For example, if a received symbol z=+7, then when compared with a+1, the result is a 7. Similarly, if z=−7, when compared to a−1, the result is again a 7. Another possibility is to use the signed magnitude representation, also shown in FIG. 10. However, signed magnitude representation generally. results in large branch metrics.

In an offset binary representation in accordance with the invention, instead of computing the likelihood, the inverse of the likelihood is computed, where likelihood is proportional to the distance between the received symbol and the code word. For example, if a received symbol z=0000, then its distance from 0 is 0, and its distance from 1 is 1111. Thus, a strong match results in a zero branch metric and a weak match in a very large metric. FIG. 11 shows the distance values for all possible 4-bit soft symbol values. In the offset binary representation, the distances can be obtained by simple exclusive-or (XOR) operations on the bits. As noted above, the total branch metric is obtained by summing over the n distances. An advantage of using the offset binary technique of the present invention is that the path metrics do not grow as fast as they would for a conventional 2's complement implementation. As a result, conventional renormalization of the path metrics is performed less frequently using the offset binary technique. Renormalization refers generally to the process of adjusting a set of computed values when one or more of those values reach a designated level so as to permit continued fixed-point computation. In comparing the hardware requirements, the offset binary technique of the invention can be implemented using XORs and adders, while the conventional 2's complement technique requires adders and subtractors. In the illustrative embodiment, use of the offset binary technique of the invention leads to an approximately 25% reduction in the area required for the branch metric calculator.

Figure 12:
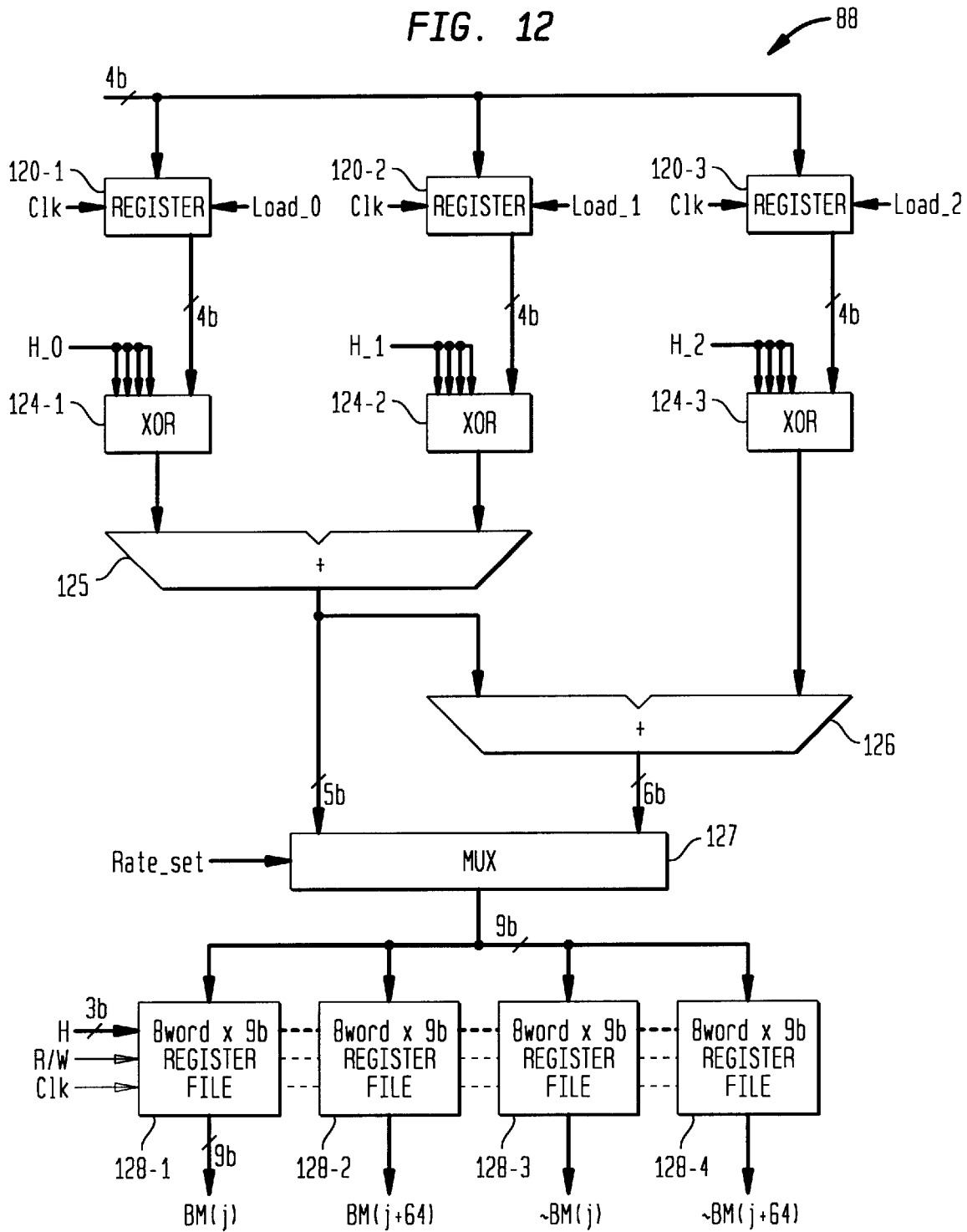
FIG. 12 shows an illustrative embodiment of a branch metric calculator for use in the Viterbi decoder of FIG. 9.

FIG. 12 shows an illustrative embodiment of the branch metric calculator 88 of the FIG. 9 decoder in greater detail. 4-bit soft symbol values are loaded into registers 120-1, 120-2 and 120-3 from the multiplexer 84. If the code rate is 1/3, three symbols are loaded, and if the code rate is 1/2, two symbols are loaded. Hypothesis vectors H_0, H_1 and H_2 are loaded into corresponding XOR gates 124-1, 124-2 and 124-3. A given hypothesis vector sequences from 000 to 111 for rate 1/3, and from 00 to 11 for rate 1/2. The outputs of the XOR gates 124-1 and 124-2 are applied to an adder 125, and the output of adder 125 is applied along with the output of XOR gate 124-3 to an adder 126. The resulting branch metrics at the outputs of adders 125 and 126 are applied as inputs to a multiplexer 127, which directs the metrics into register files 128-1, 128-2, 128-3 and 128-4 for storage. In this embodiment, four register files are used to allow four simultaneous reads as required by the ACS engine 90.

Figure 13:
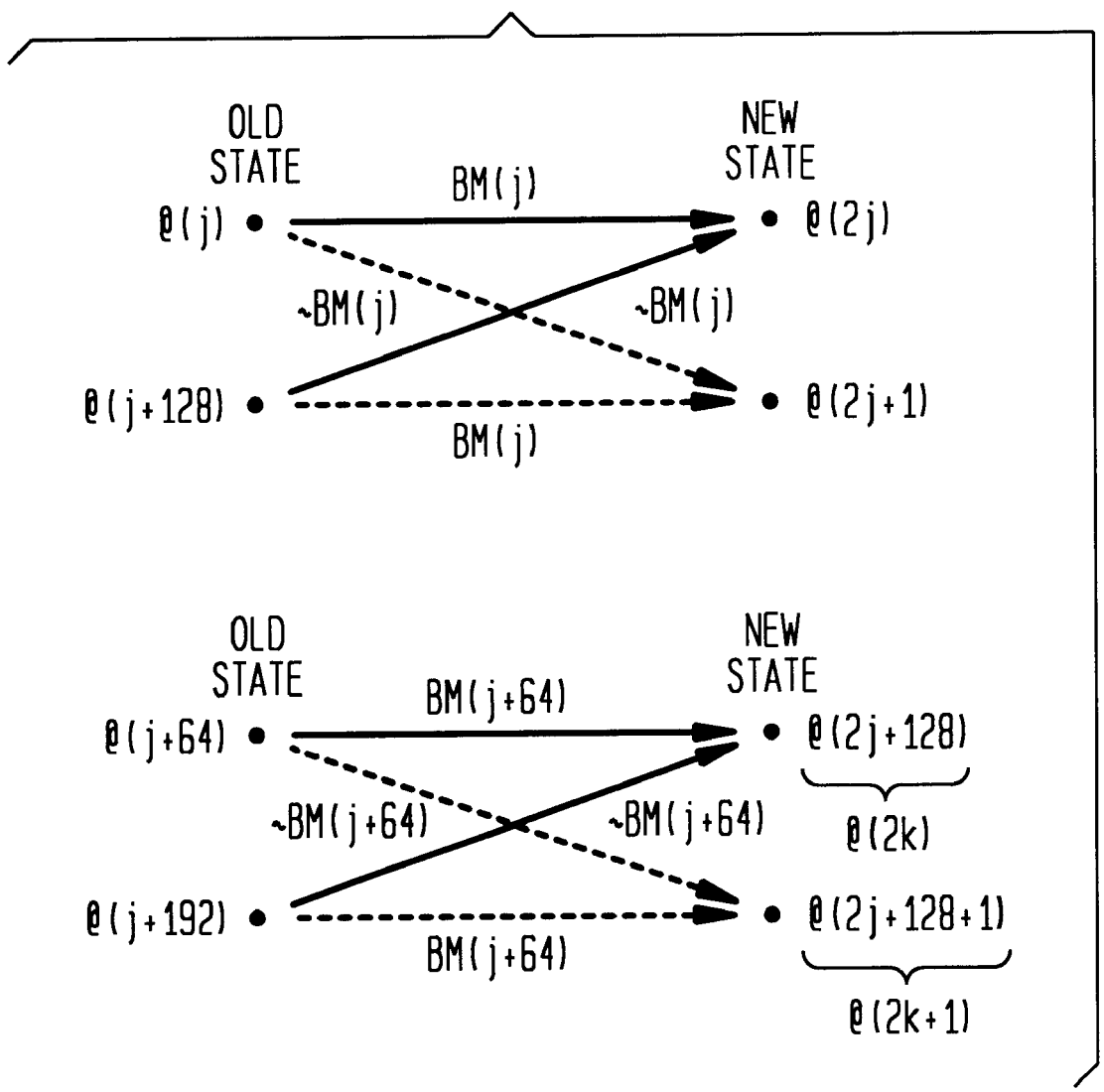
FIGS. 13 and 14 illustrate ACS computations and memory organization, respectively, in an ACS engine for use in the Viterbi decoder of FIG. 9.
Figure 14:
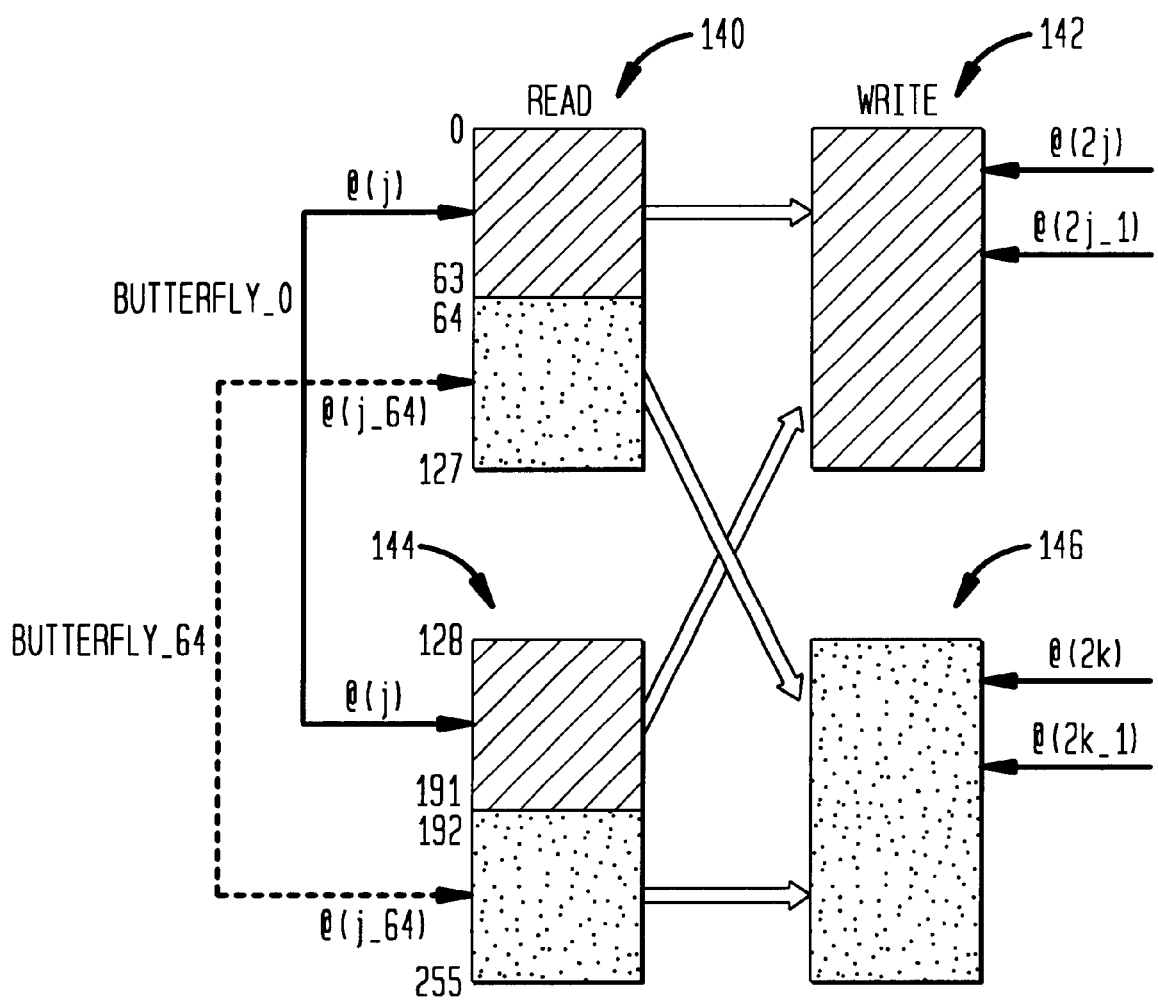

FIG. 13 illustrates the ACS operations implemented in ACS engine 90 of decoder 75, and FIG. 14 shows the memory organization of the computation. Based on simulation results, a traceback length of 64 was selected for the illustrative embodiment. This implies that the traceback operation requires 64 clock cycles. Since there are 256 states in the exemplary trellis, in order to completely overlap the ACS operation with the traceback operation, four state metrics need to be updated every clock cycle, i.e., two "butterfly" structures computed every clock cycle. One trellis stage is therefore computed in 64 clock cycles. The two butterfly structures which are computed for each clock cycle are shown in FIG. 13. The memory organization in FIG. 14 includes four dual-ported random access memories (RAMs) 140, 142, 144 and 146. Note that if one butterfly was computed every clock cycle, four RAMs would generally still be needed in this embodiment. However, if more than two butterflies are to be computed every clock cycle, then more than four RAMs would generally be needed. Thus, two butterflies per clock cycle is the maximum computation for minimal memory, and therefore an optimal configuration.

Each of the dual-ported RAMs 140, 142, 144 and 146 stores 128 10-bit words, with 9 of the bits of each word for the state metric, and 1 bit for the Yamamoto bit. Since each of the RAMs 140, 142, 144 and 146 can support either two reads or two writes, the technique illustrated in FIG. 14 provides optimal use of the available memory. In this technique, states read from locations 0 to 63 in RAM 140 and locations 128 to 191 in RAM 144 will write only from locations 0 to 127 in RAM 142. Thus the lower write RAM 146 will be idle for these write operations. Maximum utilization of all four RAMs can be obtained by allowing states read from locations 64 to 127 in RAM 140 and states read from locations 192 to 255 in RAM 144 to write locations 128 to 255 in RAM 146.

Figures 15, 15A:
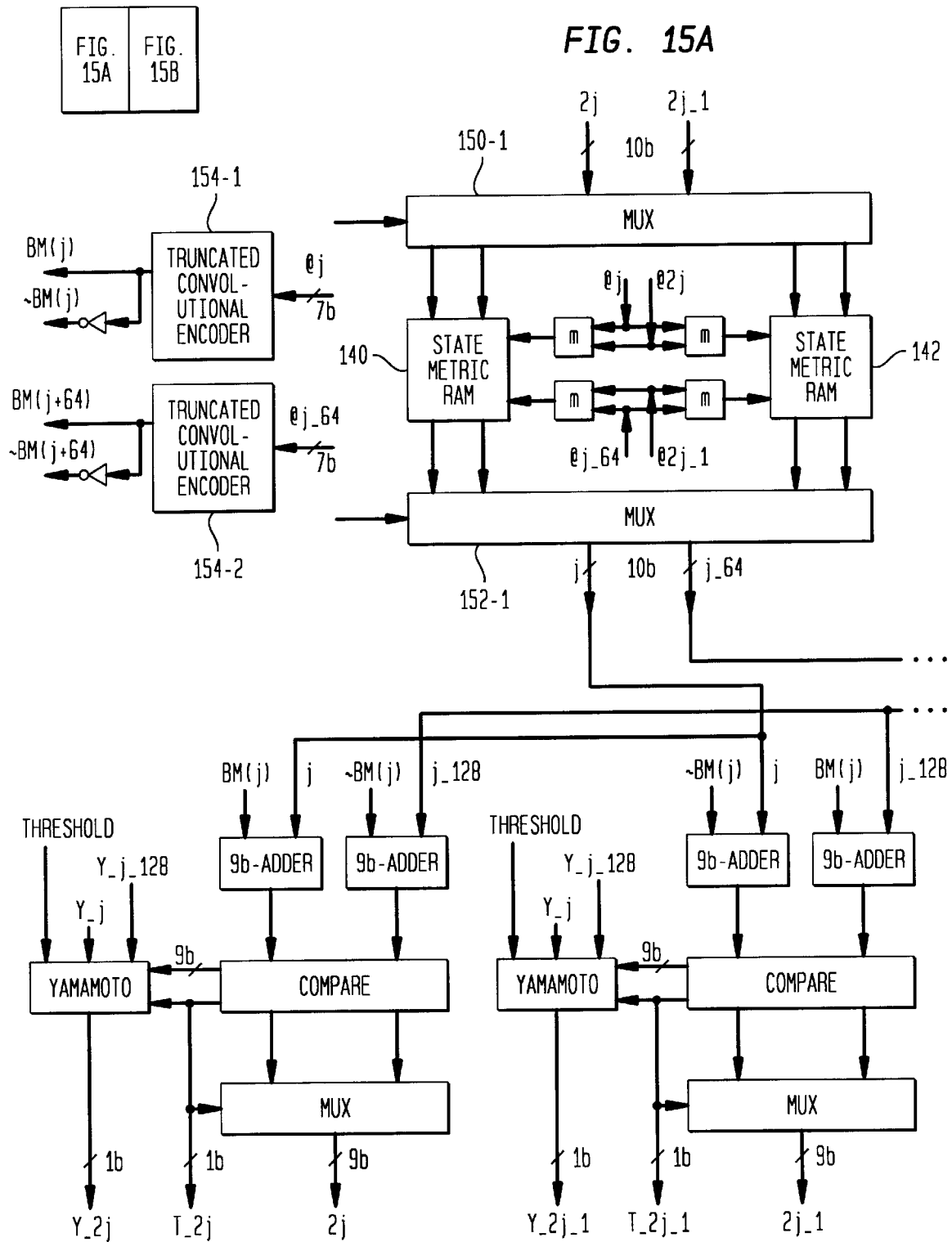
FIG. 15 shows an illustrative embodiment of an ACS engine suitable for use in the Viterbi decoder of FIG. 9.
Figure 15B:
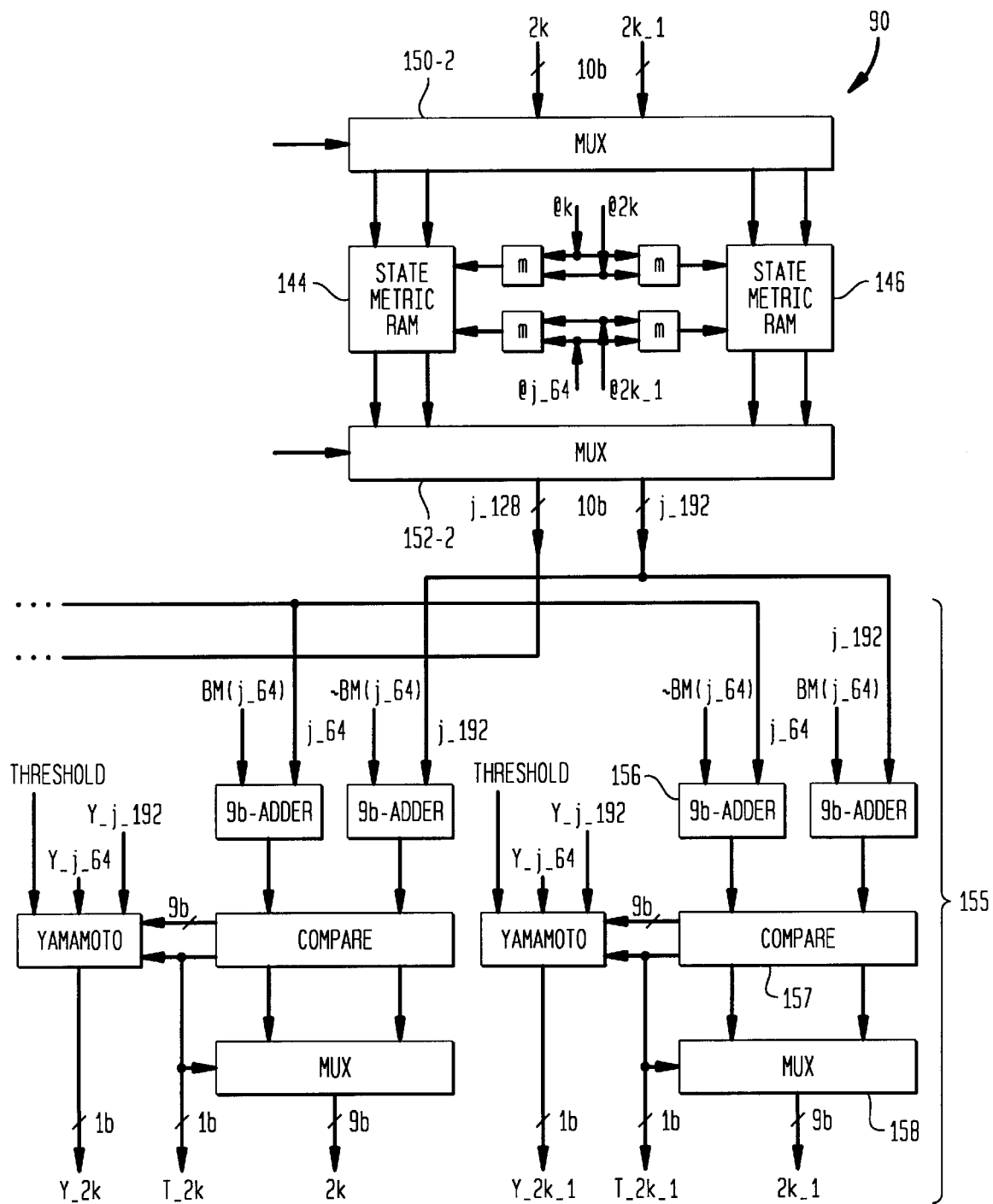

FIG. 15 shows an illustrative embodiment of ACS engine 90 in greater detail. The RAMs 140, 142, 144 and 146 operate in a "ping-pong" fashion, i.e., during one trellis stage, state metrics would be read from the RAMS 140, 144 and written to the RAMs 142, 146, whereas in the next stage the roles would reverse. In other words, at time T, the "next state" is being written in the RAMs from which the "present state" would be read at time 2T. As noted above, the state metric RAMs are each 10 bits wide, 9 bits for the state metrics and 1 bit for the Yamamoto bit. Multiplexers 150-1 and 150-2 select data to be written into the RAMs 140, 142, 144 and 146, and multiplexers 152-1 and 152-2 deliver retrieved data to ACS circuitry 155 which includes adders 156, compare units 157 and multiplexers 158 arranged as shown. The read addresses sent to the RAMs are also sent to truncated convolutional encoders 154-1 and 154-2 which generate the proper addresses to retrieve the corresponding branch metrics. As noted previously, this embodiment uses four branch metric register files to supply four unique branch metrics required to implement four ACS decisions. The ACS engine 90 also generates one bit for the traceback operation. If the surviving path is j, a 0 is stored for the traceback bit, otherwise if the surviving path is j+128, a 1 is stored. This way, if the traceback bit is shifted into the MSB of address 2j, the state connected to the surviving path is reached. The ACS circuitry 155 compares the four surviving state metrics to determine the smallest. The smallest metric is then used for renormalization as well as for initiating traceback.

FIGS. 16A through 16G illustrate the operation of a traceback memory which may be implemented in the traceback unit 92 in accordance with the invention. For applications with large constraint length codes, such as the above-described IS-95 base station receiver, the size of the traceback memory is an important factor in determining the cost of the implementation and the feasibility of integration with other functions on the same chip. Defining a factor L as 256*64, conventional Viterbi decoder chips are generally designed with traceback memories of size 3 L, although traceback memories of size 1.5 L have also been proposed. An area-efficient decoder in accordance with the invention can be implemented using a traceback memory with a size on the order of L. This improvement is provided in an illustrative embodiment using a staging register 160 in the form of four 64-stage shift registers 160-i, i=1, 2, 3 and 4, and a functional 64 word by 256 bit traceback RAM 162.

Figure 16A:
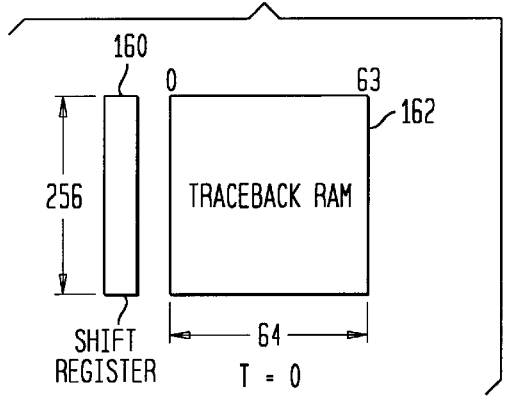
FIGS. 16A through 16G illustrate the operation of a circular buffer traceback memory technique in accordance with the invention.
Figure 16B:
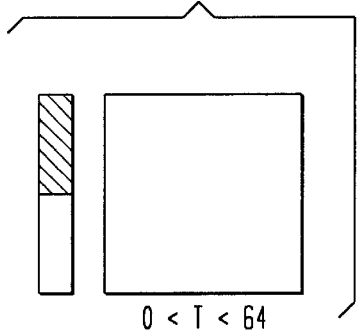
Figure 16C:
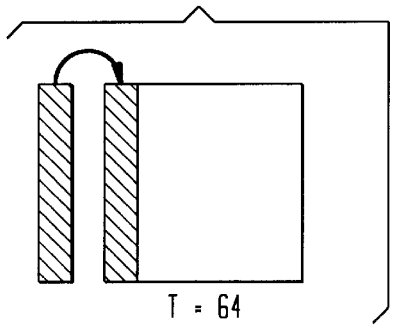
Figure 16D:
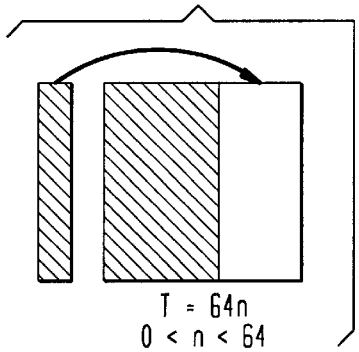
Figure 16E:
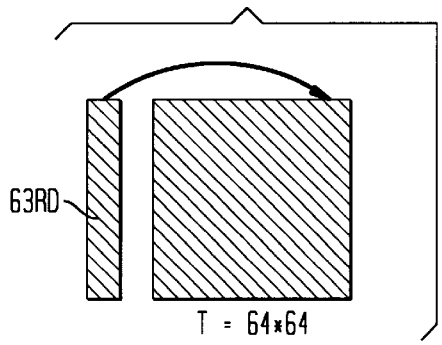
Figure 16F:
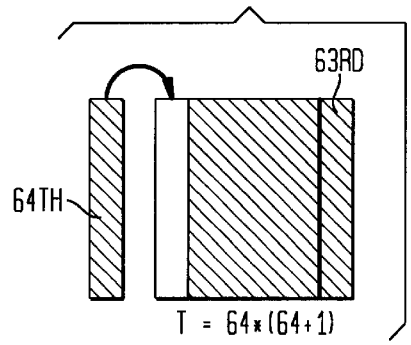
Figure 16G:
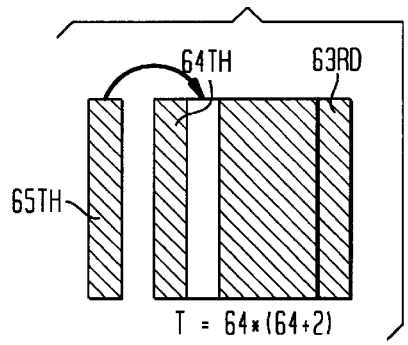

FIG. 16A shows the staging register 160 and the traceback RAM 162 at time T=0. The 64×256 bit traceback RAM may be implemented using eight 64×32 RAMs. It takes 64 clock cycles to write the staging register 160. After 64 cycles, the staging register 160 is written to the traceback RAM 162. The traceback RAM utilizes a circular buffer read/write implementation strategy in accordance with the invention, as illustrated in FIGS. 16B through 16G. FIG. 16B shows the staging register 160 filling with data during time 0<T<64. Once the staging register 160 is full, at time T=64, its contents are transferred to the traceback RAM 162 as shown in FIG. 16C, and this process continues as shown in FIGS. 16D and 16E until time T=64*64, when the traceback RAM 162 becomes full. At this point, traceback is initiated, and the traceback starts at stage 63 to push out the bit at stage 0. This process takes 64 clock cycles. During this time, the ACS engine 90 has again filled the staging register 160. At the end of the 64 cycles, i.e., at time T=64*(64+1), stage 0 is empty, corresponding to address 0 in the traceback RAM 162, and stage 64 is written into address 0 as shown in FIG. 16F. Note that 64 mod 64 is zero, i.e., the next traceback starts at stage 64 (address 0) to push out one bit at stage 1. At the end of 64 cycles, i.e., at time T=64*(64+2), stage 1 is empty, corresponding to address 1 in the traceback RAM 162, and stage 65 is written into address 1, as shown in FIG. 16G. Thus, the mapping between stage address and traceback RAM address is by mod 64.

FIG. 17 shows an illustrative embodiment of the traceback unit 92 in greater detail. The traceback unit 92 includes the above-described staging register 160 implemented as four 64-stage shift registers 160-1, 160-2, 160-3 and 160-4. These shift registers are coupled to the 64×256 traceback RAM 162 which is implemented as a single-ported RAM in this embodiment. Note that the four shift registers do not write contiguous pointers in the traceback RAM 162. Instead of trying to reorder the data, which would result in a large network of criss-crossing wires, the address to the traceback RAM is split and reordered using a 4:1 multiplexer 173 in conjunction with a 64:1 multiplexer 174. The multiplexers 173, 174 extract the relevant traceback pointer from a given set of 256 bits in the traceback RAM 162, and the pointer is pushed into the MSB input of an 8-stage shift register 175 previously loaded with an initial address 176. The LSB bits from the shift register 175 are the output bits, which are latched in the relevant output shift register 177-1, 177-2, 177-3 or 177-4 at the end of the traceback operation. As previously noted, shift registers 177-1, 177-2, 177-3 and 177-4 may be viewed as an alternative to the output buffer 97 of FIG. 9. The improved traceback techniques of the invention can reduce the amount of traceback memory required in the decoder by a factor of 50% or more relative to a conventional configuration. Additional details regarding conventional traceback memory configurations can be found in, for example, R. Cypher and C. B. Shung, "Generalized Traceback Techniques for Survivor Memory Management in the Viterbi Algorithm," IEEE Globecom, pp. 1318–1322, December 1990.

Figure 18:
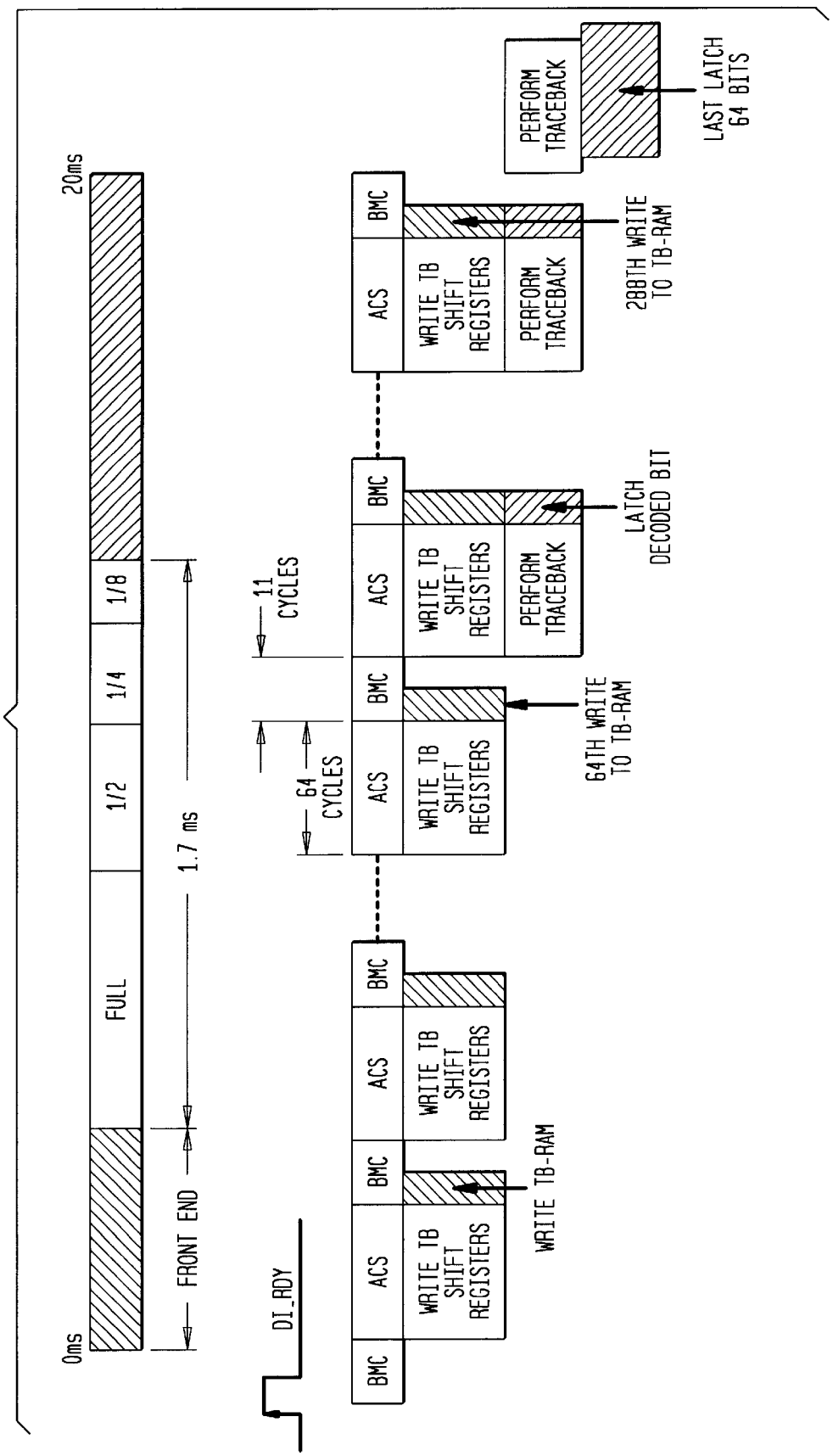
FIG. 18 is a timing diagram illustrating the timing of various operations in the Viterbi decoder of FIG. 9 for an exemplary data frame.

FIG. 18 is a timing diagram for the illustrative Viterbi decoder 75 of FIG. 9, for an exemplary 20 ms data frame in the above-described IS-95 base station receiver application. At the end of the demodulation process, a DI_RDY signal commences the decoding process. If the received channel is a traffic channel, as previously noted, all four rates need to be decoded. The full rate is decoded first, followed by the half rate, then quarter rate and lastly eighth rate. For the access channel, the data transmission is at a fixed rate, and the decoding is therefore performed only once. For the rate 1/3 code, the Viterbi decoder 75 fetches three soft symbols sequentially from the deinterleaver 72 and loads them into the registers 120-1, 120-2 and 120-3 of the branch metric calculator 88. It then sequences through eight hypotheses, and stores the corresponding branch metrics in the register files 128-1, 128-2, 128-3 and 128-4 of the branch metric calculator 88. This process takes 11 clock cycles. For the rate 1/2 code, the process will take 7 clock cycles.

The control then passes to the ACS engine 90, which takes 64 clock cycles to complete one stage. During this process, the traceback pointers are being written to the four shift registers 160-1, 160-2, 160-3 and 160-4 of the traceback unit 92. At the end of the ACS computation, the contents of these shift registers are written to the traceback RAM 162. Concurrently, the branch metric calculator 88 has been fetching the next three code symbols, and computing another set of branch metrics. The cycle repeats until the traceback RAM 162 is filled up. At this point, the traceback unit 92 initiates traceback, and traceback is done concurrently with the ACS operation. At the end of 64 cycles, the traceback unit 92 pushes out one decoded bit, and the shift registers 160-1, 160-2, 160-3 and 160-4 dump their contents into the slot that has been freed up in the traceback RAM 162. This process continues until the last trellis stage is written into the RAM 162. At that point, the branch metric calculator 88 and the ACS engine 90 go into an idle mode, and the traceback unit pushes out the last set of bits. Once this rate is finished, control passes to the next rate, until decoding for all four rates is completed. The entire process is then repeated for the next data frame. The resulting throughput for the area-efficient Viterbi decoder at a clock rate of 20 MHz is 0.32 Mbps for the rate 1/2 code and 0.26 Mbps for the rate 1/2 code. This implementation can decode up to 10 CDMA channels in real time, i.e., in one 20 ms frame.

It should be emphasized that the exemplary Viterbi decoder described herein is intended to illustrate the operation of the invention, and therefore should not be construed as limiting the invention to any particular embodiment or group of embodiments. For example, although well suited for implementation in a base station receiver of an IS-95 system, the invention can be used to provide an area-efficient decoder in other applications utilizing convolutional codes. Moreover, embodiments with a wide variety of different code rates, constraint lengths, numbers of states in the trellis, traceback lengths, and so on can be implemented to accommodate the needs of a particular application. These and numerous other alternative embodiments within the scope of the following claims will therefore be apparent to those skilled in the art.

What is claimed is:

1. A convolutional decoder for decoding received symbols in a communication system, comprising:
   a branch metric calculator for computing branch metrics for transitions in a trellis representative of a convolutional code used to generate the symbols, wherein the branch metrics are computed from an offset binary representation of the symbols, wherein computation of the branch metrics from the offset binary representation of the symbols results in a reduction in path metric growth rate relative to that produced if the branch metrics are computed from a two's complement representation of the symbols;
   an add-compare-select engine which processes path metrics generated from the branch metrics so as to determine a selected path through at least a portion of the trellis; and
   a traceback unit for generating a sequence of decoded bits from the selected path.

2. The apparatus of claim 1 wherein the branch metric calculator is operative to compute the branch metrics such that a strong match between a given received symbol and a possible codeword of the convolutional code results in a small branch metric, while a weaker match between a given received symbol and a possible codeword results in a larger branch metric.

3. The apparatus of claim 1 wherein the add-compare-select engine utilizes a state-serial architecture.

4. The apparatus of claim 1 wherein the branch metric calculator stores computed branch metrics in k sets of registers, and the add-compare-select engine processes path metrics for k states of a given stage of the trellis per clock cycle.

5. The apparatus of claim 1 wherein the add-compare-select engine includes a plurality of distinct memories, such that during a given trellis stage path metrics are read from a first one of the memories and written to a second one of the memories, and during a subsequent trellis stage path metrics are read from the second one of the memories and written to the first one of the memories.

6. The apparatus of claim 1 wherein the add-compare-select engine includes at least four distinct memories, and is operative to perform two butterfly computations per clock cycle.

7. The apparatus of claim 1 wherein the traceback unit includes a staging register and a traceback memory, and the staging register receives selected path information from the add-compare-select engine, and further wherein the contents of the staging register are loaded into the traceback memory when the staging register reaches a designated fullness, and traceback is initiated when the traceback memory reaches a designated fullness.

8. The apparatus of claim 7 wherein the traceback unit generates the decoded bits from a given portion of the traceback memory upon initiation of the traceback, and the given portion is subsequently filled with additional selected path information from the staging register.

9. The apparatus of claim 7 wherein the address of a portion of the traceback memory corresponding to a given trellis stage is determined as a number of the stage modulo a traceback length.

10. The apparatus of claim 7 wherein the staging register writes non-contiguous data to the traceback memory, and the traceback unit further includes a plurality of multiplexers configured to extract a relevant bit from a given set of bits in the traceback memory.

11. A method of decoding received symbols in a communication system, the method comprising the steps of:
    computing branch metrics for transitions in a trellis representative of a convolutional code used to generate the symbols, wherein the branch metrics are computed from an offset binary representation of the symbols, the computation of the branch metrics from the offset binary representation of the symbols resulting in a reduction in path metric growth rate relative to that produced if the branch metrics are computed from a two's complement representation of the symbols;
    processing path metrics generated from the branch metrics so as to determine a selected path through at least a portion of the trellis; and
    generating a sequence of decoded bits from the selected path.

12. The method of claim 11 wherein the computing step further includes computing the branch metrics such that a strong match between a given received symbol and a possible codeword of the convolutional code results in a small branch metric, while a weaker match between a given received symbol and a possible codeword results in a larger branch metric.

13. The method of claim 11 wherein the computing and processing steps further include storing computed branch metrics in k sets of registers, and processing path metrics for k states of a given stage of the trellis per clock cycle.

14. The method of claim 11 wherein the processing step further includes utilizing a plurality of distinct memories for the path metrics, such that during a given trellis stage path metrics are read from a first one of the memories and written to a second one of the memories, and during a subsequent trellis stage path metrics are read from the second one of the memories and written to the first one of the memories.

15. The method of claim 11 wherein the processing step further includes utilizing at least four distinct memories, and performing two butterfly computations per clock cycle.

16. The method of claim 11 wherein the generating step further includes the steps of:
    storing selected path information in a staging register;
    loading the contents of the staging register into a traceback memory when the staging register reaches a designated fullness; and
    initiating traceback when the traceback memory reaches a designated fullness.

17. The method of claim 16 wherein the generating step further includes generating the decoded bits from a given portion of the traceback memory upon initiation of the traceback, and subsequently filling the given portion with additional selected path information from the staging register.

18. The method of claim 16 further including determining an address of a portion of the traceback memory corresponding to a given trellis stage as a number of the stage modulo a traceback length.

19. The method of claim 16 wherein the staging register writes non-contiguous data to the traceback memory, and the generating step further includes utilizing a plurality of multiplexers to extract a relevant bit from a given set of bits in the traceback memory.

20. A convolutional decoder for decoding received symbols in a communication system, comprising:

a branch metric calculator for computing branch metrics for transitions in a trellis representative of a convolutional code used to generate the symbols;

an add-compare-select engine which processes path metrics generated from the branch metrics so as to determine a selected path through at least a portion of the trellis; and a traceback unit for generating a sequence of decoded bits from the selected path, wherein the traceback unit includes a staging register and a traceback memory, and the staging register receives selected path information from the add-compare-select engine, and further wherein the contents of the staging register for a given stage of the trellis are loaded into the traceback memory when the staging register reaches a designated fullness, at a location given by a number of the stage modulo a traceback length.

21. A convolutional decoder for decoding received symbols in a communication system, comprising:

a branch metric calculator for computing branch metrics for transitions in a trellis representative of a convolutional code used to generate the symbols;

an add-compare-select engine which processes path metrics generated from the branch metrics so as to determine a selected path through at least a portion of the trellis, wherein the add-compare-select engine includes at least four distinct memories each storing a plurality of state metrics and is operative to perform two butterfly computations per clock cycle, wherein for a given clock cycle, two of the memories are used for reading previous state metrics, and two of the memories are used for writing new state metrics, and further wherein two read addresses are generated for a given clock cycle for use in reading the previous state metrics, such that for the given clock cycle, results of processing the previous state metrics, that are read from particular portions of the two memories using the two read addresses, are written to designated portions of the other two memories; and a traceback unit for generating a sequence of decoded bits from the selected path.

22. A convolutional decoder for decoding received symbols in a communication system, comprising:

a branch metric calculator for computing branch metrics for transitions in a trellis representative of a convolutional code used to generate the symbols, wherein the branch metrics are computed from an offset binary representation of the symbols using an inverse likelihood function;

an add-compare-select engine which processes path metrics generated from the branch metrics so as to determine a selected path through at least a portion of the trellis; and a traceback unit for generating a sequence of decoded bits from the selected path, wherein the traceback unit includes a staging register and a traceback memory, and the staging register receives selected path information from the add-compare-select engine, and further wherein the contents of the staging register are loaded into the traceback memory when the staging register reaches a designated fullness, and traceback is initiated when the traceback memory reaches a designated fullness.

23. A method of decoding received symbols in a communication system, the method comprising the steps of:

computing branch metrics for transitions in a trellis representative of a convolutional code used to generate the symbols, wherein the branch metrics are computed from an offset binary representation of the symbols using an inverse likelihood function;

processing path metrics generated from the branch metrics so as to determine a selected path through at least a portion of the trellis; and generating a sequence of decoded bits from the selected path;

wherein the generating step further includes the steps of:

storing selected path information in a staging register;

loading the contents of the staging register into a traceback memory when the staging register reaches a designated fullness; and initiating traceback when the traceback memory reaches a designated fullness.

* * * * *